United States Patent
Nishimura

(10) Patent No.: US 10,283,314 B2
(45) Date of Patent: May 7, 2019

(54) CHARGED PARTICLE BEAM WRITING APPARATUS, AND CHARGED PARTICLE BEAM WRITING METHOD

(71) Applicant: NUFLARE TECHNOLOGY, INC., Kanagawa (JP)

(72) Inventor: Rieko Nishimura, Yokohama (JP)

(73) Assignee: NUFLARE TECHNOLOGY, INC., Kanagawa (JP)

( * ) Notice: Subject to any disclaimer, the term of this patent is extended or adjusted under 35 U.S.C. 154(b) by 0 days.

(21) Appl. No.: 15/789,276

(22) Filed: Oct. 20, 2017

(65) Prior Publication Data

US 2018/0122616 A1   May 3, 2018

(30) Foreign Application Priority Data

Oct. 28, 2016   (JP) .................................. 2016-211750

(51) Int. Cl.
   *H01J 37/147*   (2006.01)
   *H01J 37/304*   (2006.01)
   *H01J 37/317*   (2006.01)

(52) U.S. Cl.
   CPC ........ *H01J 37/1472* (2013.01); *H01J 37/304* (2013.01); *H01J 37/3177* (2013.01); *H01J 2237/1504* (2013.01)

(58) Field of Classification Search
   USPC .................................................... 250/492.3
   See application file for complete search history.

(56) References Cited

U.S. PATENT DOCUMENTS

| 4,943,729 A * | 7/1990 | Ando | H01J 37/3026 |
| | | | 250/398 |
| 4,950,910 A * | 8/1990 | Yasuda | B82Y 10/00 |
| | | | 250/398 |
| 8,748,064 B2 | 6/2014 | Nishimura et al. | |
| 8,779,379 B2 | 7/2014 | Nishimura | |
| 9,653,263 B2 * | 5/2017 | Platzgummer | H01J 37/3177 |
| 2015/0131075 A1 * | 5/2015 | Kato | H01J 37/3177 |
| | | | 355/77 |

FOREIGN PATENT DOCUMENTS

JP   2013-058699 A   3/2013
JP   2013-232616 A   11/2013

* cited by examiner

*Primary Examiner* — Phillip A Johnston
(74) *Attorney, Agent, or Firm* — Cermak Nakajima & McGowan LLP; Tomoko Nakajima

(57) ABSTRACT

A charged particle beam writing apparatus includes a number of shots calculation circuit to calculate the number of shots in the case where a deflection region is irradiated with a shot of a charged particle beam, a deflection position correcting circuit to correct a deflection position of the charged particle beam to be shot in the deflection region, depending on the number of shots to be shot in the deflection region, and a deflector to deflect the charged particle beam to a corrected deflected position on the target object.

13 Claims, 15 Drawing Sheets

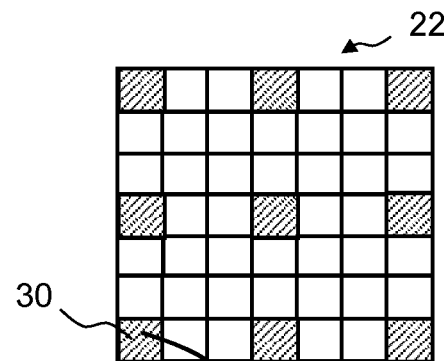
FIG.4A
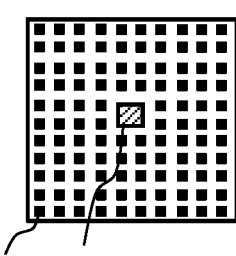
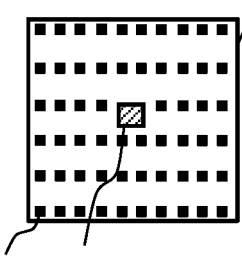
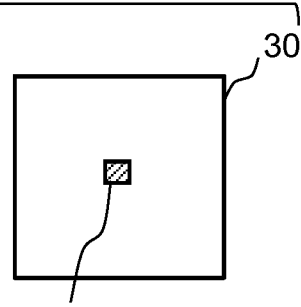
100%  50%  0%
FIG.4B  FIG.4C  FIG.4D

100%

50%

0%

FIG.12B 0% 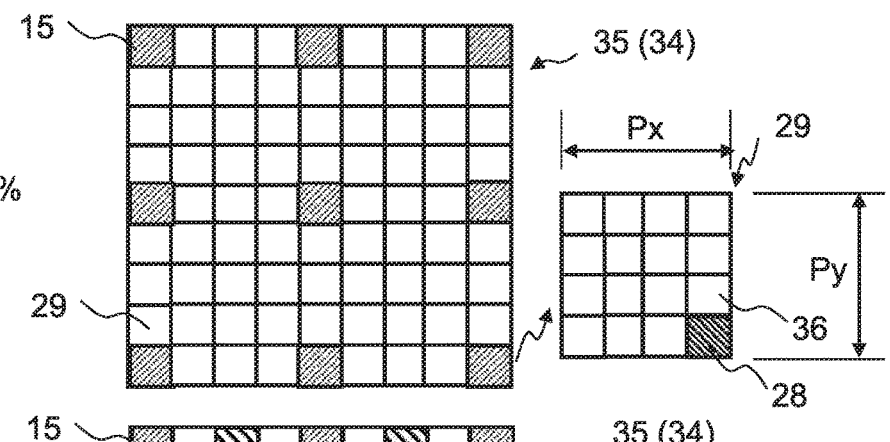
FIG.12C 50% 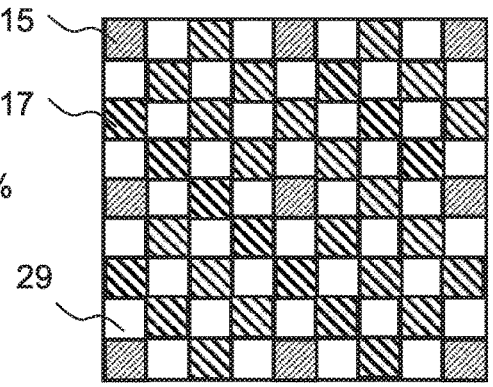
FIG.12D 100% 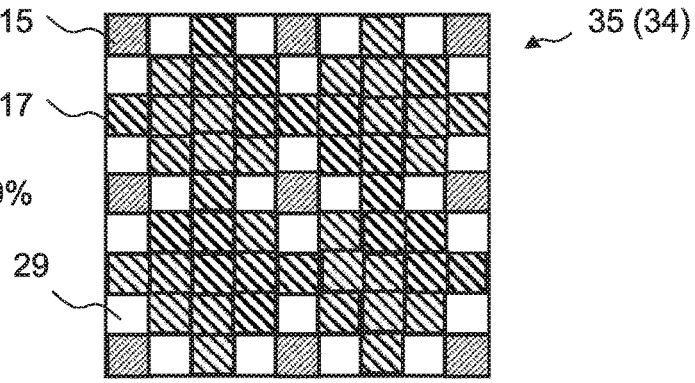

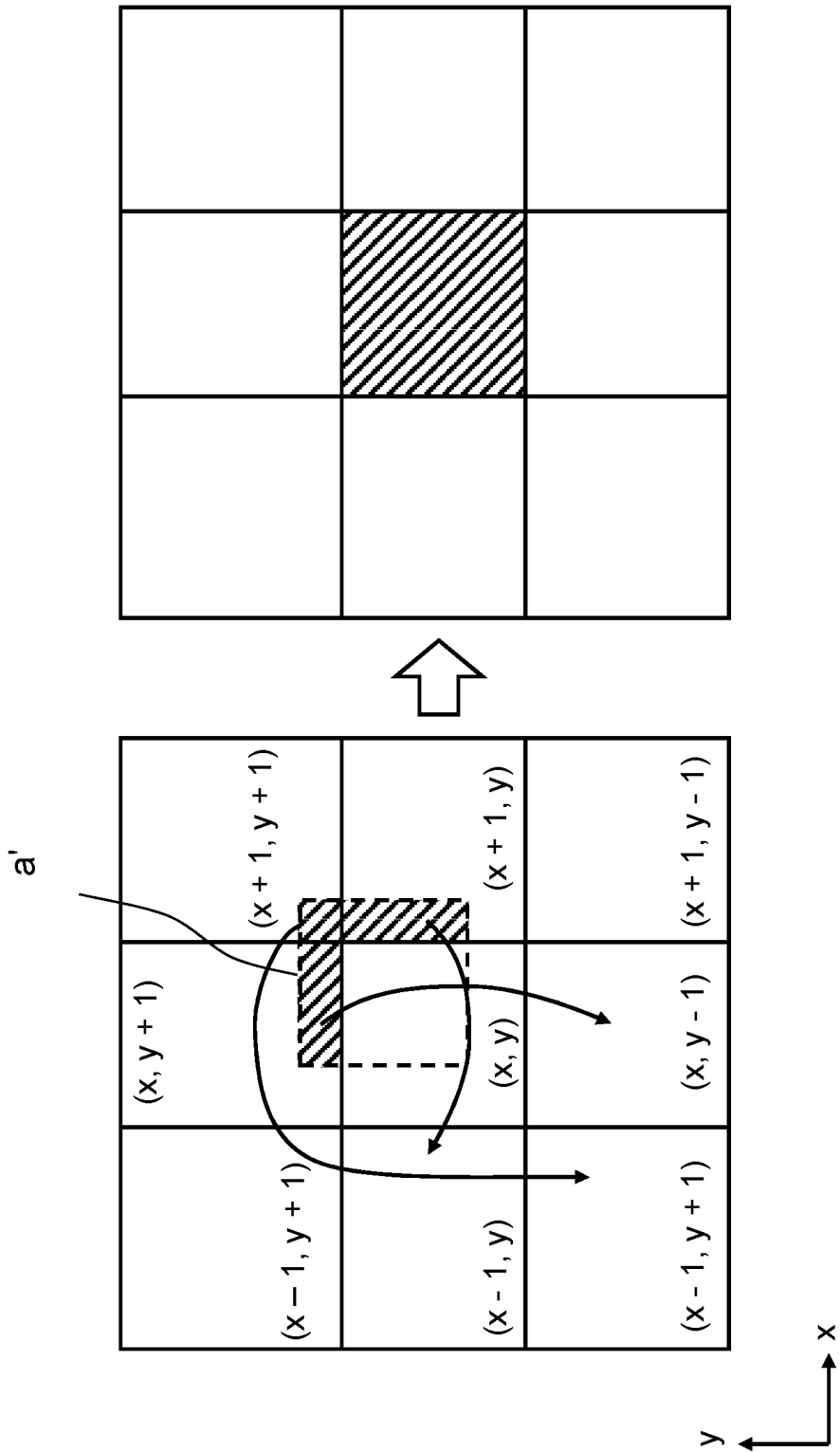

CHARGED PARTICLE BEAM WRITING APPARATUS, AND CHARGED PARTICLE BEAM WRITING METHOD

CROSS-REFERENCE TO RELATED APPLICATION

This application is based upon and claims the benefit of priority from the prior Japanese Patent Application No. 2016-211750 filed on Oct. 28, 2016 in Japan, the entire contents of which are incorporated herein by reference.

BACKGROUND OF THE INVENTION

Field of the Invention

Embodiments of the present invention relate to a charged particle beam writing apparatus and a charged particle beam writing method, and, for example, relate to a method for correcting a deflection deviation depending on the number of shots in a deflection region in the electron beam writing apparatus.

Description of Related Art

In recent years, with high integration of LSI, the line width (critical dimension) required for semiconductor device circuits is decreasing year by year. An electron beam (EB) writing technique which has excellent resolution is used as a method of producing an exposure mask (also referred to as a reticle) for forming a circuit pattern on such semiconductor vices.

FIG. 8 is a conceptual diagram explaining operations of a variable-shaped electron beam writing or "drawing" apparatus. The variable-shaped electron beam writing apparatus operates as described below. A first aperture plate 410 has a quadrangular (rectangular) aperture 411 for shaping an electron beam 330. A second aperture plate 420 has a variable shape aperture 421 for shaping the electron beam 330 having passed through the aperture 411 of the first aperture plate 410 into a desired quadrangular shape. The electron beam 330 emitted from a charged particle source 430 and having passed through the aperture 411 is deflected by a deflector to pass through a part of the variable shape aperture 421 of the second aperture plate 420, and thereby to irradiate a target object or "sample" 340 placed on a stage which continuously moves in one predetermined direction (e.g., x direction) during writing. In other words, a quadrangular shape that can pass through both the aperture 411 of the first aperture plate 410 and the variable shape aperture 421 of the second aperture plate 420 is used for pattern writing in a writing region of the target object 340 on the stage continuously moving in the x direction. This method of forming a given shape by letting beams pass through both the aperture 411 of the first aperture plate 410 and the variable shape aperture 421 of the second aperture plate 420 is referred to as a variable shaped beam (VSB) system.

With respect to the electron beam writing apparatus, it is known that the shape of the deflection region of the deflector changes by such as a voltage applied to the control circuit, the objective deflector, etc. Therefore, the shape of the deflection region is conventionally measured by actually writing an evaluation pattern for measuring a deflection shape, and measuring the position, etc. of the formed written pattern by a measuring instrument (e.g., refer to Japanese Patent Application Laid-open (JP-A) No. 2013-232616).

On the other hand, with the progress of the recent high precision and miniaturization of circuit patterns typified by semiconductor devices, in a variable shaped type electron beam writing apparatus, the beam size needs to be reduced whereas there is a tendency to increase the number of shots of the electron beam. By contrast, no increase occurs in the number of shots with respect to an alignment mark, ID, etc. which has no direct relation to circuit patterns. Thus, there is a difference between the numbers of shots. If a large difference occurs between the numbers of shots, due to this difference, a large difference will also occur in the number of times of voltage application, etc. to the control circuit, objective deflector, etc. per deflection region. Therefore, there is concern about the influence on the shape of the deflection region of the deflector. However, since a measurable size by a measuring instrument is limited, it is difficult to reduce the beam size unnecessarily. Accordingly, the evaluation pattern for measuring the shape of the deflection region described above is also limited in size. Consequently, because of this limitation, it is difficult to increase the number of shots in the deflection region in order to obtain an evaluation result considering the number of shots. Therefore, conventionally, the influence of the number of shots on the shape of the deflection region has not been able to be evaluated. This state may not be ignorable with respect also to the accuracy of the circuit pattern actually written.

BRIEF SUMMARY OF THE INVENTION

According to one aspect of the present invention, a charged particle beam writing apparatus includes a number of shots calculation circuit configured to calculate a number of shots in a case where a deflection region is irradiated with a shot of a charged particle beam, a deflection position correcting circuit configured to correct a deflection position of the charged particle beam to be shot in the deflection region, depending on the number of shots to be shot in the deflection region, and a deflector configured to deflect the charged particle beam to a corrected deflected position on a surface of a target object.

According to another aspect of the present invention, a charged particle beam writing method includes calculating a number of shots in a case where a deflection region is irradiated with a shot of a charged particle beam, correcting a deflection position of the charged particle beam to be shot in the deflection region, depending on the number of shots to be shot in the deflection region, and writing a pattern on a target object by deflecting the charged particle beam to a corrected deflection position on a surface of the target object.

According to yet another aspect of the present invention, a charged particle beam writing apparatus includes an area density calculation circuit configured to calculate an area density of a pattern arranged in each of a plurality of processing regions obtained by dividing a writing region of a target object by a size of an irradiation region which can be irradiated with whole multi charged particle beams, a correction circuit configured to correct a dose amount of a beam that causes a position deviation, using a change amount of an irradiation region shape of the multi charged particle beams in a processing region concerned in the plurality of processing regions which is produced depending on the area density of the each of the plurality of processing regions, and a writing mechanism configured to irradiate the processing region concerned on the target object by the multi charged particle beams of a corrected dose amount.

According to yet another aspect of the present invention, a charged particle beam writing method includes calculating an area density of a pattern arranged in each of a plurality of processing regions obtained by dividing a writing region of a target object by a size of an irradiation region which can be irradiated with whole multi charged particle beams, correcting a dose amount of a beam that causes a position deviation, using a change amount of an irradiation region shape of the multi charged particle beams in a processing region concerned in the plurality of processing regions which is produced depending on the area density of the each of the plurality of processing regions, and irradiating the processing region concerned on the target object by the multi charged particle beams of a corrected dose amount.

BRIEF DESCRIPTION OF THE DRAWINGS

FIGS. 4A to 4D show examples of a main deflection region and evaluation patterns according to the first embodiment;

FIGS. 12A to 12D show examples of a processing region and an evaluation pattern corresponding to an irradiation region according to the second embodiment;

FIGS. 15A and 15B illustrate an example of a method of correcting a positional deviation according to the second embodiment.

DETAILED DESCRIPTION OF THE INVENTION

Embodiments below describe an apparatus and method which can perform writing in consideration of the influence of the number of shots on the shape of the deflection region.

In Embodiments below, there will be described a configuration in which an electron beam is used as an example of a charged particle beam. The charged particle beam is not limited to the electron beam, and other charged particle beam such as an ion beam may also be used. Moreover, a writing apparatus of a variable shaped beam type will be described as an example of a charged particle beam writing apparatus.

First Embodiment

Figure 1:
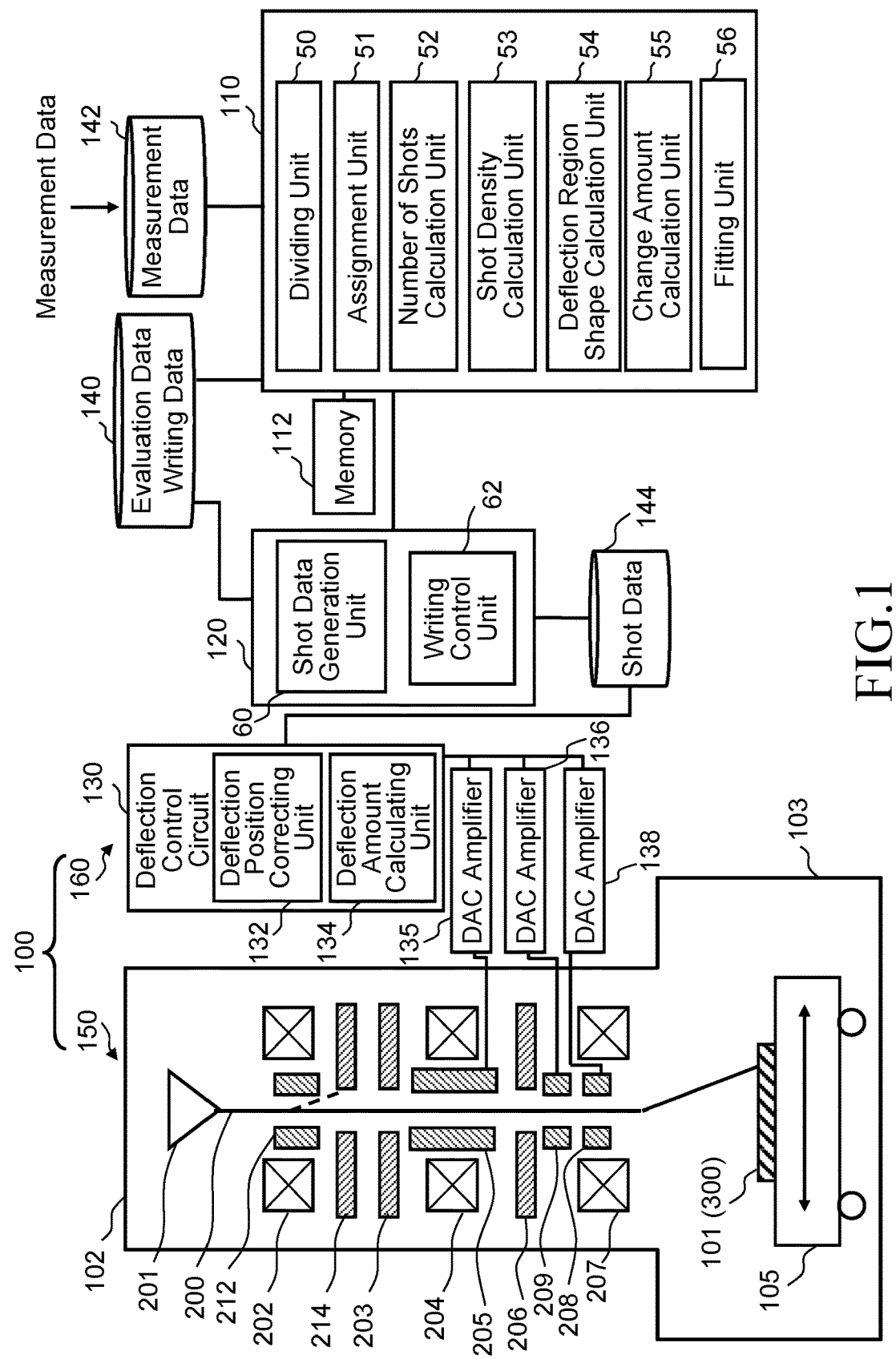
FIG. 1 is a schematic diagram showing a configuration of a writing apparatus according to a first embodiment.

FIG. 1 is a schematic diagram showing a configuration of a writing apparatus according to a first embodiment. In FIG. 1, a writing apparatus 100 includes a writing mechanism 150 and a control system circuit 160. The writing apparatus 100 is an example of a charged particle beam writing apparatus, and particularly, an example of a variable shaped beam (VSB) writing apparatus. The writing mechanism 150 includes an electron optical column 102 and a writing chamber 103. In the electron optical column 102, there are arranged an electron gun 201, an illumination lens 202, a blanking deflector (blanker) 212, a blanking aperture substrate 214, a first shaping aperture substrate 203, a projection lens 204, a deflector 205, a second shaping aperture substrate 206, an objective lens 207, a main deflector 208, and a sub deflector 209. In the writing chamber 103, there is arranged an XY stage 105 that is movable at least in the x-y direction. On the XY stage 105, there is placed a target object 101 (substrate) serving as a writing target on which resist has been applied. The target object 101 is an exposure mask, a silicon wafer, and the like used for manufacturing semiconductor devices. The mask may be, for example, a mask blank.

The control system circuit 160 includes a control computers 110 and 120, a memory 112, a deflection control circuit 130, a DAC (digital-analog converter) amplifiers units 135, 136, and 138 (deflection amplifiers), and storage devices 140, 142, and 144 such as magnetic disk drives. The control computers 110 and 120, the memory 112, the deflection control circuit 123, and the storage devices 140, 142, and 144 are connected with each other through a bus (not shown). The deflection control circuit 130 is connected to the DAC amplifiers 135, 136, and 138. The DAC amplifier 136 is connected to the sub deflector 209. The DAC amplifier 138 is connected to the main deflector 208. The DAC amplifier 135 is connected to the sub deflector 205.

In the control computer 110, there are arranged a dividing unit 50, an assignment unit 51, a number of shots calculation unit 52, a shot density calculation unit 53, a deflection region shape calculation unit 54, a change amount calculation unit 55, and a fitting unit 56. Each of the " . . . units" such as the dividing unit 50, the assignment unit 51, the number of shots calculation unit 52, the shot density calculation unit 53, the deflection region shape calculation unit 54, the change amount calculation unit 55, and the fitting unit 56 includes a processing circuitry. As the processing circuitry, for example, an electric circuit, computer, processor, circuit board, quantum circuit, or semiconductor device may be used. Each of the " . . . units" may use a common processing circuitry (same processing circuitry), or different processing circuitries (separate processing circuitries). Input data necessary in the dividing unit 50, the assignment unit 51, the number of shots calculation unit 52, the shot density calculation unit 53, the deflection region shape calculation unit 54, the change amount calculation unit 55, and the fitting unit 56, and operated (calculated) results are stored in the memory 112 each time.

In the control computer 120, there are arranged a shot data generation unit 60 and a writing control circuit 62. Each of the " . . . units" such as the shot data generation unit 60 and the writing control circuit 62 includes a processing circuitry. As the processing circuitry, for example, an electric circuit, computer, processor, circuit board, quantum circuit, or semiconductor device may be used. Each of the " . . . units" may use a common processing circuitry (same processing circuitry), or different processing circuitries (separate processing circuitries). Input data necessary in the shot data generation unit 60 and the writing control circuit 62, and operated (calculated) results are stored in a memory (not shown) each time.

In the deflection control circuit 130, there are arranged a deflection position correcting unit 132 and a deflection amount calculating unit 134. Each of the " . . . units" such as the deflection position correcting unit 132 and the deflection amount calculating unit 134 includes a processing circuitry. As the processing circuitry, for example, an electric circuit, computer, processor, circuit board, quantum circuit, or semiconductor device may be used. Each of the " . . . units" may use a common processing circuitry (same processing circuitry), or different processing circuitries (separate processing circuitries). Input data necessary for the deflection position correcting unit 132 and the deflection amount calculating unit 134, and operated (calculated) results are stored in a memory (not shown) each time.

Evaluation chip data that defines data of an evaluation chip (evaluation pattern) in which an evaluation figure pattern and a non-resolution pattern are arranged is input from the outside of the writing apparatus 100, and stored in the storage device 140. Moreover, writing data that defines data of a chip in which a plurality of patterns configuring a circuit pattern are arranged is input from the outside of the writing apparatus 100, and stored in the storage device 140.

FIG. 1 shows configuration elements necessary for describing the first embodiment. It should be understood that other configuration elements generally necessary for the writing apparatus 100 may also be included therein.

Figure 2:
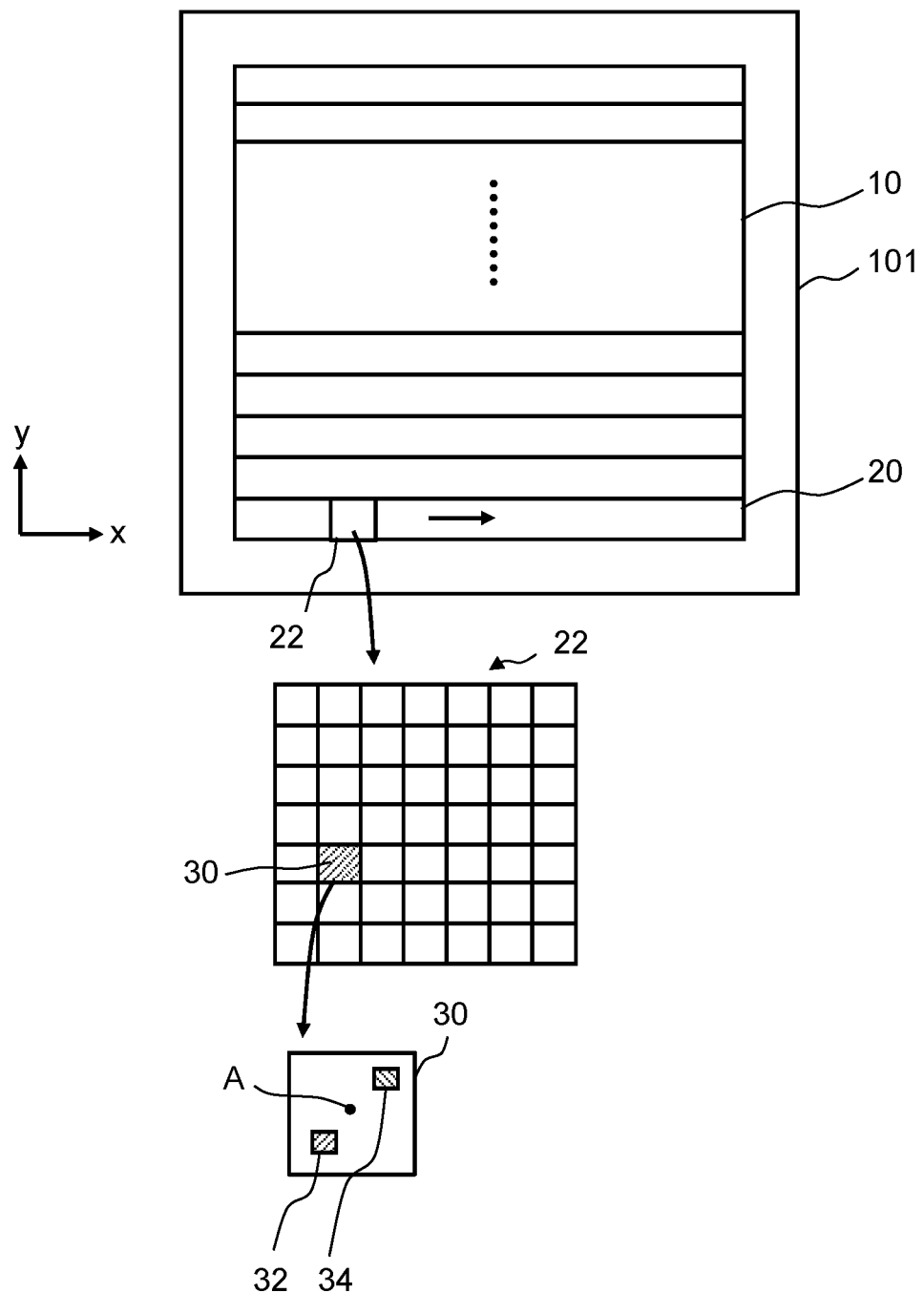
FIG. 2 is a conceptual diagram for explaining each region according to the first embodiment.

FIG. 2 is a conceptual diagram for explaining each region according to the first embodiment. In FIG. 2, a writing region 10 of the target object 101 is virtually divided by the width deflectable by the main deflector 208 (first deflector) into a plurality of strip-shaped stripe regions 20 arrayed, for example, along the y direction. The region, in a plurality of stripe regions 20, which is surrounded in both the x and y directions by the width deflectable by the main deflector 208 (first deflector) is a deflection region 22 (main deflection region: first deflection region) of the main deflector 208 (first deflector). The main deflection region is not formed at a fixed position in the stripe region 20, but serves as a deflectable range of electron beams from the electron optical column 102 side. Therefore, with the movement of the XY stage 105, the main deflection region relatively moves in a stripe region 32 to be written. Further, each stripe region 20 is virtually divided by the size deflectable by the sub deflector 209 (second deflector) into a plurality of mesh-like sub-fields (SF) 30 (sub-deflection region: second deflection region). Shot FIGS. 32 and 34 are written at respective shot positions in each SF 30. Thus, a multiple stage deflector is configured by the two-stage deflector which deflects an electron beam 200. The deflection region is defined as the main deflection region or the SF 30 in order from larger to smaller in size of the region to be deflected.

A digital signal for blanking control is output from the deflection control circuit 130 to a DAC amplifier (not shown). Then, in the amplifier (not shown), the digital signal is converted to an analog signal and amplified to be applied as a deflection voltage to the blanking deflector 212. The electron beam 200 is deflected by this deflection voltage, and thereby a beam of each shot is formed.

A digital signal to control deflection for shaping is output from the deflection control circuit 130 to the DAC amplifier 135. Then, in the DAC amplifier 135, the digital signal is converted to an analog signal and amplified to be applied as a deflection voltage to the deflector 205. The electron beam 200 is deflected for shaping by this deflection voltage, and thereby a beam of each shot is variably shaped to be a desired shape and size.

A digital signal for controlling main deflection is output from the deflection control circuit 130 to the DAC amplifier 138. Then, in the DAC amplifier 138, the digital signal is converted to an analog signal and amplified to be applied as a deflection voltage to the main deflector 208. The electron beam 200 is deflected by this deflection voltage, and thereby each beam shot is deflected to a reference position (for example, a center position A of the SF 30 concerned) of a predetermined subfield (SF) obtained by a virtual division into mesh-like regions. Moreover, in the case of performing writing while continuously moving the XY stage 105, the deflection voltage also includes a deflection voltage for tracking to follow the movement of the stage.

A digital signal for controlling sub-deflection is output from the deflection control circuit 130 to the DAC amplifier 136. Then, in the DAC amplifier unit 136, the digital signal is converted to an analog signal and amplified to be applied as a deflection voltage to the sub deflector 209. The electron beam 200 is deflected by this deflection voltage, and thereby a beam of each shot is deflected to a shot position in the SF 30.

When performing writing processing, the writing control circuit 62 starts writing while controlling the deflection control circuit 130 and the writing mechanism 150. In the deflection control circuit 130, the shot position (deflection position) defined by shot data is corrected according to an error of the shape of the deflection region. The writing mechanism 150 writes a pattern with the electron beam 200 at a corrected shot position. Specifically, it operates as follows:

With respect to the electron beam 200 emitted from the electron gun 201 (emitter), when passing through the blanking deflector 212, the beam is controlled to pass through the blanking aperture substrate 214 by the blanking deflector 212 when in the beam ON condition, and the whole of the beam is deflected to be blocked by the blanking aperture substrate 214 when in the beam OFF condition. The electron beam 200 that has passed through the blanking aperture substrate 214 during the period from changing a beam OFF condition to a beam ON condition to changing the beam ON condition to a beam OFF condition serves as one shot of the electron beam. The blanking deflector 212 controls the direction of the passing electron beam 200 to alternately generate a beam ON condition and a beam OFF condition. For example, when in a beam ON condition, no voltage is applied to the blanking deflector 212, and, when in a beam OFF condition, a voltage should be applied to it. The dose per shot of the electron beam 200 to irradiate the target object 101 is adjusted depending upon the irradiation time of each shot.

As described above, each shot of the electron beam 200 generated by passing through the blanking deflector 212 and the blanking aperture substrate 214 irradiates the whole of the first shaping aperture substrate 203 having a quadrangular opening by the illumination lens 202. At this stage, the electron beam 200 is first shaped to a quadrangle. Then, after passing through the first shaping aperture substrate 203, the electron beam 200 of the first aperture image is projected onto the second shaping aperture substrate 206 by the projection lens 204. The first aperture image on the second shaping aperture substrate 206 is deflection-controlled by the deflector 205 so as to change (variably shape) the shape and size of the beam. Such variable shaping is performed for each shot, and each shot is generally shaped to have a different shape and size. Then, after passing through the second shaping aperture substrate 206, the electron beam 200 of the second aperture image is focused by the objective lens 207, and deflected by the main deflector 208 and the sub deflector 209 to reach a desired position on the target object 101 placed on the XY stage 105 which moves continuously. Thus, a plurality of shots of the electron beam 200 are deflected in order, by each deflector, onto the target object 101 serving as a substrate.

The writing apparatus 100 performs writing processing in each stripe region 20 by using a multiple stage deflector of a plurality of stages. Here, as an example, a two-stage deflector composed of the main deflector 208 and the sub deflector 209 is used. While the XY stage 105 is continuously moving in the −x direction, for example, writing is performed in the x direction in the first stripe region 20. After the writing has been finished in the first stripe region 20, continuously writing is performed in the same direction or in the opposite direction in the second stripe region 20. Then, in the same way, writing is performed in the third and subsequent stripe regions 20. The main deflector 208 (first deflector) sequentially deflects the electron beam 200 to the reference position of the SF 30 such that the movement of the XY stage 105 is followed. The sub deflector 209 (second deflector) deflects the electron beam 200 from the reference position of each SF 30 to a shot position of the beam with which the SF 30 concerned is irradiated. Thus, the sizes of the deflection regions of the main deflector 208 and the sub deflector 209 are different from each other.

Here, the SF 30 is formed having the size of 9 μm square, for example. An evaluation pattern for evaluating the shape of a deflected pattern needs to be formed having the size measurable by a pattern position measuring instrument (position measuring device). The pattern position measuring instrument can measure the width of 0.2 μm or more, for example. Therefore, if an evaluation pattern is formed having the size, for example, 0.35 μm square per shot, only twenty-five evaluation patterns can be arranged in the SF 30 of 9 μm square. Since it is necessary to have a space between evaluation patterns in order to measure a position, if a space of the same size as the evaluation pattern is formed, for example, only twelve evaluation patterns can be arranged. Therefore, in such a case, it turns out that one-hundred and forty-four (=12×12) shots can be performed at the maximum in the SF 30.

Although two-stage deflection is employed in the example described above, the number of stages of multiple stage deflection is not limited to two stages. For example, it is also preferable to employ three-stage deflection to divide the SF 30 into a plurality of small regions (TF). Alternatively, multiple stage deflection of four or more stages may also be used. For example, in the case of three-stage deflection, only one shot can be performed in the third stage deflection region (TF), for example.

Thus, with respect to the deflection region of each stage, there is a limit on the number of shots. Therefore, it is difficult to know (ascertain) the change of the shape of the deflection region, depending upon the number of shots. Then, according to the first embodiment, an evaluation pattern capable of performing multiple shots is realized regardless of the size of the deflection region, which will be described in detail below.

Figure 3:
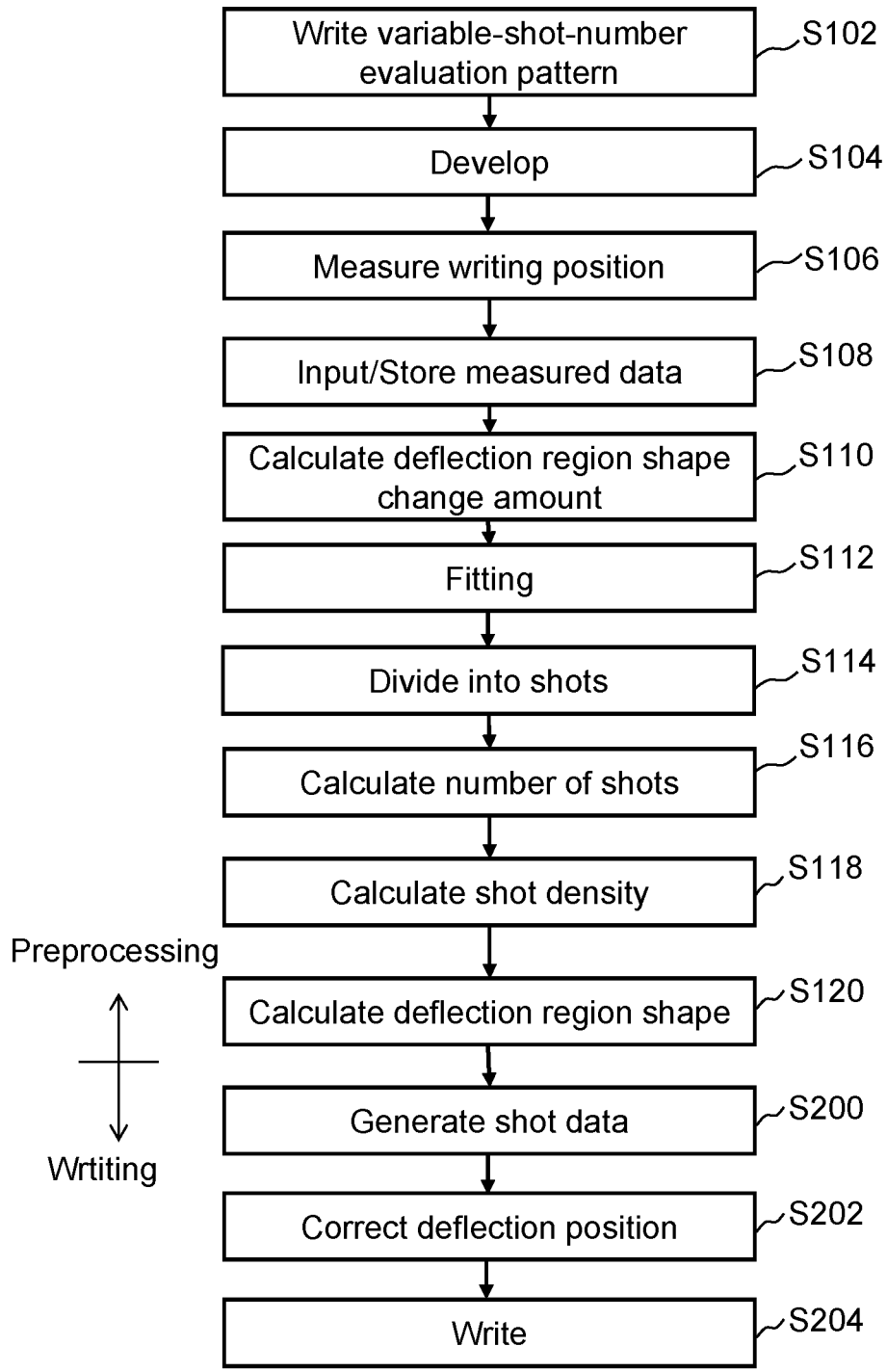
FIG. 3 is a flowchart showing main steps of a writing method according to the first embodiment.

FIG. 3 is a flowchart showing main steps of a writing method according to the first embodiment. In FIG. 3, the writing method of the first embodiment executes a series of steps: an evaluation pattern writing step (S102), a development step (S104), a writing position measurement step (S106), a measured data input/storage step (S108), a shape change amount calculation step (S110), a fitting step (S112), a dividing step (S114), a number of shots calculation step (S116), a shot density calculation step (S118), a deflection region shape calculation step (S120), a shot data generation step (S200), a deflection position correcting step (S202), and a writing step (S204).

In the evaluation pattern writing step (S102), the writing apparatus 100 writes, on an evaluation substrate 300, a plurality of evaluation patterns in the state where the number of shots is variable.

FIGS. 4A to 4D show examples of a main deflection region and evaluation patterns according to the first embodiment. FIG. 4A shows the main deflection region 22. In the main deflection region 22, a plurality of SFs 30 are arranged in a mesh configuration. FIG. 4A shows the case where forty-nine (7×7) SFs 30 are arranged in rows and columns. The number of SFs 30 is not limited thereto, and may be greater than or less than 7×7. For specifying/identifying the deflection region shape of the main deflection region 22, it is sufficient to measure deflection positions for deflecting to, for example, 3×3 (rows and columns) SFs 30 including the SF 30 at each of the four corners of the main deflection region 22. The greater the number of SFs is, the higher the precision of the region shape can be acquired. Here, the case of writing 3×3 (rows and columns) SFs 30 will be described. An evaluation pattern is written, in the state where the shot density is 100%, in each of 3×3 SFs 30 in one main deflection region 22 on the evaluation substrate 300. Further, an evaluation pattern is written, in the state where the shot density is 50%, in each of 3×3 SFs 30 in another main deflection region 22 on the evaluation substrate 300. Moreover, an evaluation pattern is written, in the state where the shot density is 0%, in each of 3×3 SFs 30 in further another main deflection region 22 on the evaluation substrate 300. Since the lower limit of the pattern size when using the pattern position measuring instrument is restricted as described above, if the pattern size remains the same, it is difficult, similarly to the conventional case, to generate a state where the shot density, namely the number of shots, is increased. Then, according to the first embodiment, a non-resolution shot pattern of a micro-size beam, equivalent to an unresolved dose is used. For example, there is used a non-resolution shot pattern 14 of a quadrangle with about the size greater than 0 nm and equal to or less than 1 nm in the x and y directions. If the size of the non-resolution shot pattern 14 is equal to or larger than the control grid size (AU: address unit) of the DAC amplifier 135 for beam shaping, it is possible to shape a beam into a micro-size beam.

FIG. 4B shows an example of an evaluation pattern in the state where the shot density is 100%. Here, an evaluation figure pattern 12 having the size (e.g., 0.2 μm or more) measurable by a pattern position measuring instrument is arranged at a reference position (e.g., center position in SF 30) of the SF 30 to be deflected by the main deflector 208, and the whole of the other region in the SF 30 is fully filled with the non-resolution shot patterns 14 described above. Here, for example, regarding the maximum shot size for variable shaping used in actual writing as a pitch size in each of the x and y directions, a plurality of non-resolution shot patterns 14 are arranged in the whole of the other region in the SF 30 except for the position where the evaluation figure pattern 12 is arranged. Even if an unlimited amount of the non-resolution shot patterns 14 are written, since they are not resolved by developing, only the evaluation figure pattern 12 remains after the development. Therefore, it is possible to measure the position of the evaluation figure pattern 12 by the pattern position measuring instrument while performing writing in the state where the shot density is 100%.

FIG. 4C shows an example of an evaluation pattern in the state where the shot density is 50%. Here, similarly to FIG. 4B, the evaluation figure pattern 12 having the size (e.g., 0.2 μm or more) measurable by the pattern position measuring instrument is arranged at the center of the SF 30, and the whole of the other region in the SF 30 is fully filled with the non-resolution shot patterns 14 described above. However, in order to reduce the shot density, for example, every other row of the non-resolution shot pattern 14 is deleted in the y direction from the state of FIG. 4B. Thereby, a shot density of 50% can be obtained. Since the non-resolution shot patterns 14 are not resolved, only the evaluation figure pattern 12 remains after the development. Therefore, it is possible to measure the position of the evaluation figure pattern 12 by the pattern position measuring instrument while performing writing in the state where the shot density is 50%.

FIG. 4D shows an example of an evaluation pattern in the state where the shot density is 0%. Here, similarly to FIG. 4B, the evaluation figure pattern 12 having the size (e.g., 0.2 μm or more) measurable by the pattern position measuring instrument is arranged at the center of the SF 30, and nothing is written in the other region in the SF 30. Thereby, a shot density of 0% can be obtained. Naturally, only the evaluation figure pattern 12 remains after the development. Therefore, it is possible to measure the position of the evaluation figure pattern 12 by the pattern position measuring instrument while performing writing in the state where the shot density is 0%.

Figure 5A:
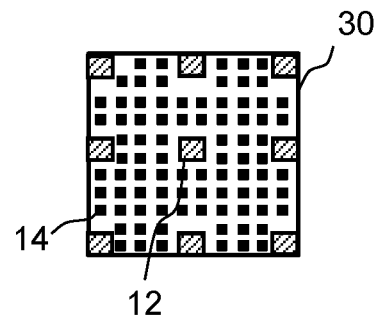
FIGS. 5A to 5C show examples of a sub deflection region and an evaluation pattern according to the first embodiment.
Figure 5B:
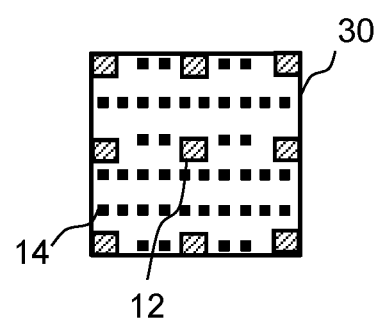
Figure 5C:
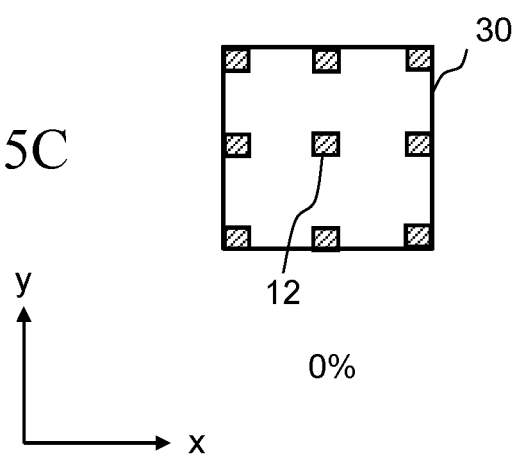

FIGS. 5A to 5C show examples of a sub deflection region and an evaluation pattern according to the first embodiment. For specifying/identifying the deflection region shape of the SF 30 (sub deflection region), it is sufficient to measure the evaluation figure patterns 12 at 3×3 deflection positions including the four corners of the SF 30. Alternatively, it is also preferable to measure evaluation figure patterns 12 at 5×5 deflection positions, for example. The greater the number of the evaluation figure patterns 12 is, the higher the precision of the region shape can be acquired. Here, the case of writing the evaluation figure patterns 12 at 3×3 deflection positions will be described. An evaluation pattern is written in the state where the shot density is 100% such that the evaluation figure patterns 12 are arranged at 3×3 deflection positions including the four corners of the SF 30 on the evaluation substrate 300. Further, an evaluation pattern is written in the state where the shot density is 50% such that the evaluation figure patterns 12 are arranged at 3×3 deflection positions including the four corners of another SF 30 on the evaluation substrate 300. Moreover, an evaluation pattern is written in the state where the shot density is 0% such that the evaluation figure patterns 12 are arranged at 3×3 deflection positions including the four corners of further another SF 30 on the evaluation substrate 300. As the SF 30 for measuring the deflection region shapes of these SFs 30, it is preferable to use a region other than the main deflection region 22 which is used for measuring the the deflection region shape of the main deflection region 22.

FIG. 5A shows an example of an evaluation pattern in the state where the shot density is 100%. Here, the evaluation figure patterns 12 each having the size (e.g., 0.2 μm or more) measurable by a pattern position measuring instrument are arranged at 3×3 deflection positions including the four corners of the SF 30, and the whole of the other region in the SF 30 is fully filled with the non-resolution shot patterns 14 described above. Here, for example, regarding the maximum shot size for variable shaping used in actual writing as a pitch size in each of the x and y directions, a plurality of non-resolution shot patterns 14 are arranged in the whole of the other region in the SF 30 except for the position where the evaluation figure pattern 12 is arranged. Even if an unlimited amount of the non-resolution shot patterns 14 are written, since they are not resolved by developing, only 3×3 evaluation figure patterns 12 including the four corners remain after the development. Therefore, it is possible to measure positions of the 3×3 evaluation figure patterns 12 including the four corners by the pattern position measuring instrument while performing writing in the state where the shot density is 100%.

FIG. 5B shows an example of an evaluation pattern in the state where the shot density is 50%. Here, similarly to FIG. 5A, the evaluation figure patterns 12 each having the size (e.g., 0.2 μm or more) measurable by the pattern position measuring instrument are arranged at 3×3 deflection positions including the four corners of the SF 30, and the whole of the other region in the SF 30 is fully filled with the non-resolution shot patterns 14 described above. However, in order to reduce the shot density, for example, every other row of the non-resolution shot pattern 14 is deleted in the y direction from the state of FIG. 5A. Thereby, a shot density of 50% can be obtained. Since the non-resolution shot patterns 14 are not resolved, only 3×3 evaluation figure patterns 12 including the four corners remain after the development. Therefore, it is possible to measure the positions of the 3×3 evaluation figure patterns 12 including the four corners by the pattern position measuring instrument while performing writing in the state where the shot density is 50%.

FIG. 5C shows an example of an evaluation pattern in the state where the shot density of 0%. Here, similarly to FIG. 5A, the evaluation figure patterns 12 each having the size (e.g., 0.2 μm or more) measurable by the pattern position measuring instrument are arranged at 3×3 deflection positions including the four corners of the SF 30, and nothing is written in the other region in the SF 30. Thereby, a shot density of 0% can be obtained. Naturally, only 3×3 evaluation figure patterns 12 including the four corners remain after the development. Therefore, it is possible to measure the positions of the 3×3 evaluation figure patterns 12 including the four corners by the pattern position measuring instrument while performing writing in the state where the shot density is 0%.

As described above, according to the first embodiment, the number of shots (shot density) is adjusted based on the number of arranged non-resolution shot patterns 14 of a micro-size beam equivalent to an unresolved dose. Moreover, since the non-resolution shot pattern 14 is not resolved, there is no limit on the number of shots. Therefore, a state of a desired shot density can be generated regardless of the size of the deflection region.

In the writing apparatus 100, first, the evaluation substrate 300 coated with resist is conveyed onto the XY stage 105 by a transmission mechanism (not shown).

The shot data generation unit 60 reads, from the storage device 140, evaluation chip data defining an evaluation pattern in a state where the number of shots is variably adjusted by a plurality of non-resolution shot patterns 14 described above, and generates shot data for evaluating a deflection region shape. Then, the evaluation pattern in a state where the number of shots is variable is written on the evaluation substrate 300 coated with resist, by the deflection control circuit 130 and the writing mechanism 150, under the control of the writing control circuit 62.

In the development step (S104), the evaluation substrate 300 on which an evaluation pattern in a state where the number of shots is variable has been written is developed. Thereby, a resist pattern of the evaluation pattern in the state where the number of shots is variable can be formed. Furthermore, etching and ashing may be performed using the resist pattern as a mask to form an evaluation pattern in a state where the number of shots is variable, on a film (e.g., chromium (Cr) film) underlying the resist film.

In the writing position measurement step (S106), the pattern position measuring instrument measures the positions of the evaluation figure patterns 12 in each of respective shot densities. Thereby, 3×3 deflection positions including the four corners of the main deflection region 22 in each of shot densities of 100%, 50%, and 0% can be measured. Similarly, 3×3 deflection positions including the four corners of the SF 30 (sub deflection region) in each of shot densities of 100%, 50%, and 0% can be measured.

In the measured data input/storage step (S108), measured data is input from the outside of the writing apparatus 100, and stored in the storage device 142.

By the process described above, it is possible to obtain measurement data for specifying the deflection region shape of the main deflection region 22 in each of shot densities of 100%, 50%, and 0%. According to the first embodiment, since the number of shots (shot density) is adjusted based on the number of arranged non-resolution shot patterns 14 of a micro-size beam equivalent to an unresolved dose, it is possible to obtain reference data indicating the amount of change of the deflection region shape depending on the number of shots, without being affected by the influence of Cr stress or resist charging of the evaluation substrate 300.

Although, in the examples described above, measuring is performed using three types of shot densities of 100%, 50%, and 0%, it is not limited thereto. It is also preferable to measure using more shot densities. By increasing the type of the shot density, a more accurate evaluation depending on the number of shots can be performed.

In the shape change amount calculation step (S110), the change amount calculation unit 55 calculates a change amount of the shape of the deflection region in each of shot densities, using a measurement result.

Figure 6:
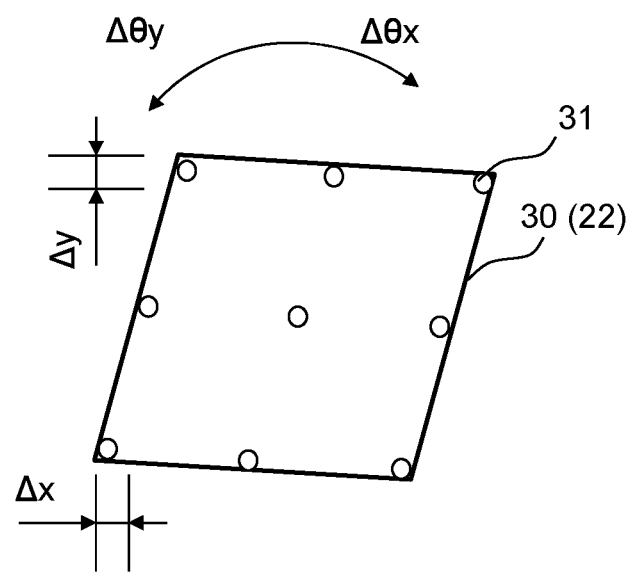
FIG. 6 shows an example of a deflection region shape according to the first embodiment.

FIG. 6 shows an example of a deflection region shape according to the first embodiment. 3×3 deflection positions 31 including the four corners of the SF 30 can be known from measurement results for each of shot densities of 100%, 50%, and 0%. Based on measured data on the main deflection region 22 in the state of the shot density being 100%, the change amount calculation unit 55 calculates a change amount $\Delta x$ in the x direction, a change amount $\Delta y$ in the y direction, a rotation change amount $\Delta\theta x$ of the x axis, and a rotation change amount $\Delta\theta y$ of the y axis of the deflection region shape of the main deflection region 22 in the state of the shot density being 100%. Similarly, based on measured data on the main deflection region 22 in the state of the shot density being 50%, the change amount calculation unit 55 calculates a change amount $\Delta x$ in the x direction, a change amount $\Delta y$ in the y direction, a rotation change amount $\Delta\theta x$ of the x axis, and a rotation change amount $\Delta\theta y$ of the y axis of the deflection region shape of the main deflection region 22 in the state of the shot density being 50%. Similarly, based on measured data on the main deflection region 22 in the state of the shot density being 0%, the change amount calculation unit 55 calculates a change amount $\Delta x$ in the x direction, a change amount $\Delta y$ in the y direction, a rotation change amount $\Delta\theta x$ of the x axis, and a rotation change amount $\Delta\theta y$ of the y axis of the deflection region shape of the main deflection region 22 in the state of the shot density being 0%.

Moreover, based on measured data on the SF 30 in the state of the shot density being 100%, the change amount calculation unit 55 calculates a change amount $\Delta x$ in the x direction, a change amount $\Delta y$ in the y direction, a rotation change amount $\Delta\theta x$ of the x axis, and a rotation change amount $\Delta\theta y$ of the y axis of the deflection region shape of the SF 30 in the state of the shot density being 100%. Similarly, based on measured data on the SF 30 in the state of the shot density being 50%, the change amount calculation unit 55 calculates a change amount $\Delta x$ in the x direction, a change amount $\Delta y$ in the y direction, a rotation change amount $\Delta\theta x$ of the x axis, and a rotation change amount $\Delta\theta y$ of the y axis of the deflection region shape of the SF 30 in the state of the shot density being 50%. Similarly, based on measured data on the SF 30 in the state of the shot density being 0%, the change amount calculation unit 55 calculates a change amount $\Delta x$ in the x direction, a change amount $\Delta y$ in the y direction, a rotation change amount $\Delta\theta x$ of the x axis, and a rotation change amount $\Delta\theta y$ of the y axis of the deflection region shape of the SF 30 in the state of the shot density being 0%.

In the fitting step (S112), the fitting unit 55 calculates, for each of the change amounts of each deflection region shape, an approximate expression depending on the shot density by fitting measurement results of the cases of three shot densities of 100%, 50%, and 0%.

Figure 7:
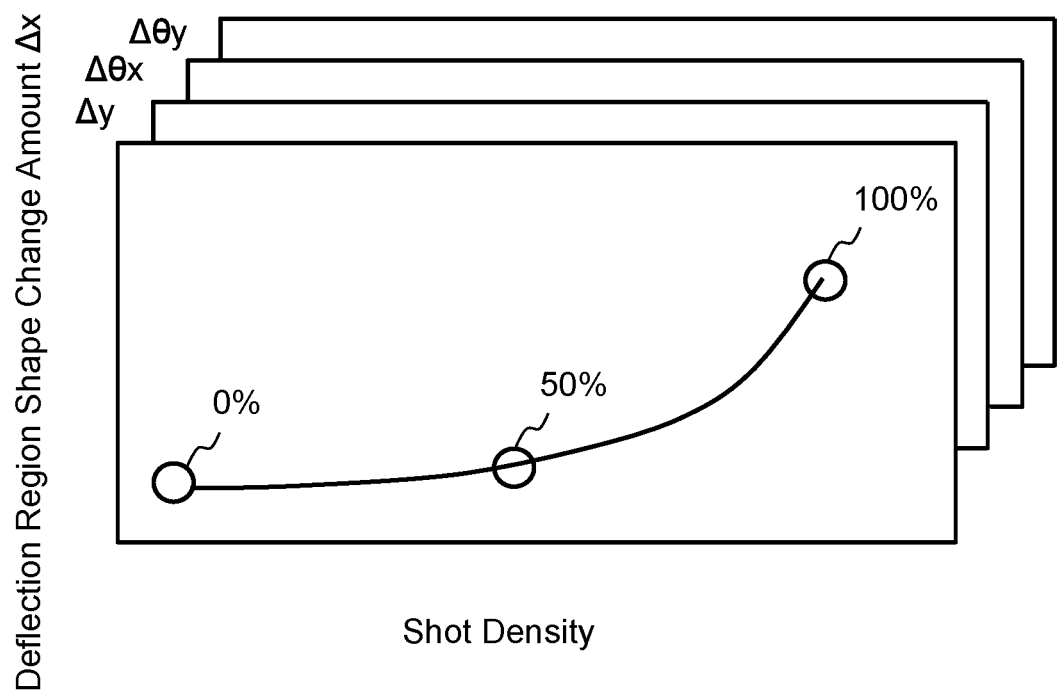
FIG. 7 shows an example of the relation between a shot density and a change amount of a deflection region shape according to the first embodiment.
Figure 8:
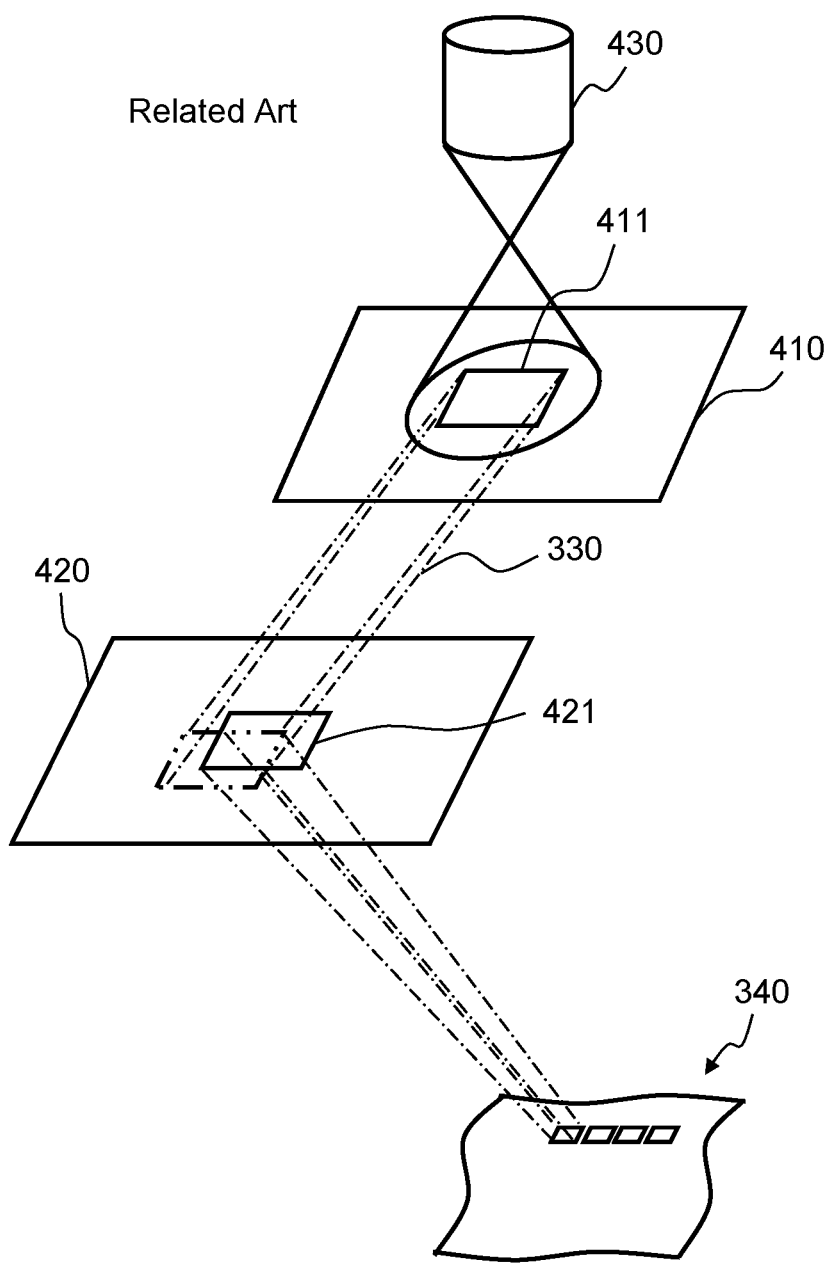
FIG. 8 is a conceptual diagram explaining operations of a variable-shaped electron beam writing apparatus.

FIG. 7 shows an example of the relation between a shot density and a change amount of a deflection region shape according to the first embodiment. In FIG. 7, the abscissa represents shot density, and the ordinate represents change amount of a deflection region shape. For example, FIG. 7 shows a change amount $\Delta x$ in the x direction of the deflection region shape of the SF 30 depending on the shot density of SF 30. The fitting unit 55 calculates an approximate expression of a change amount $\Delta x$ in the x direction of the deflection region shape of the SF 30 depending on the shot density by fitting measurement points of the cases of the three shot densities of 100%, 50%, and 0%. Similarly, the fitting unit 55 calculates an approximate expression of a change amount $\Delta y$ in the y direction of the deflection region shape of the SF 30 depending on the shot density. Similarly, the fitting unit 55 calculates an approximate expression of a rotation change amount $\Delta\theta x$ of the x axis of the deflection region shape of the SF 30 depending on the shot density. Similarly, the fitting unit 55 calculates an approximate expression of a rotation change amount $\Delta\theta y$ of the y axis of the deflection region shape of the SF 30 depending on the shot density.

Moreover, with respect also to the main deflection region 22, the fitting unit 55 calculates an approximate expression of a change amount $\Delta x$ in the x direction of the deflection region shape of the main deflection region 22 depending on the shot density. Similarly, the fitting unit 55 calculates an approximate expression of a change amount $\Delta y$ in the y direction of the deflection region shape of the main deflection region 22 depending on the shot density. Similarly, the fitting unit 55 calculates an approximate expression of a rotation change amount $\Delta\theta x$ of the x axis of the deflection region shape of the main deflection region 22 depending on the shot density. Similarly, the fitting unit 55 calculates an approximate expression of a rotation change amount $\Delta\theta y$ of the y axis of the deflection region shape of the main deflection region 22 depending on the shot density.

The shape of the deflection region in the case of actually writing a circuit pattern on the target object 101 is obtained based on these approximate expressions showing change amounts of the deflection region shape depending on the number of shots. There will be described preprocessing in the writing apparatus 100.

In the dividing step (S114), the dividing unit 50 reads, from the storage device 140, writing data defining each figure pattern data defining a figure pattern, and divides each figure pattern into a plurality of shot figures by a size that can be irradiated by one shot of the electron beam 200. The writing data is preferably read in the unit of the stripe regions 20.

The assignment unit 51 assigns shot figures to a plurality of SFs 30 of the stripe region 20 concerned.

In the number of shots calculation step (S116), the number of shots calculation unit 52 calculates the number of shots in the case of performing shots of the electron beam 200 in the deflection region. Specifically, the number of shots calculation unit 52 calculates, for each SF 30, the number of assigned shot figures (the number of shots).

In the shot density calculation step (S118), the shot density calculation unit 53 calculates a shot density in each SF 30, using the number of shots for each SF 30. For example, the calculation is performed on the assumption that shot density 100% is the case where the inside of the SF 30 is filled with shot figures of the maximum shot size at a pitch twice the maximum shot size.

Moreover, the shot density calculation unit 53 generates a shot density map whose unit is the stripe 20 where each SF 30 corresponds to one mesh. Then, the shot density calculation unit 53 calculates a shot density in each temporary main deflection region 22 obtained by dividing the stripe region 20 by the size of the main deflection region, using the shot density map whose unit is the stripe 20. Although the main deflection region 22 varies each moment with advancement of writing, the shot density does not vary largely.

In the deflection region shape calculation step (S120), the deflection region shape calculation unit 54 calculates the deflection region shape of the deflection region, depending on the number of shots. The deflection region shape can be calculated using measurement data on writing positions of a plurality of evaluation patterns obtained by writing a plurality of evaluation patterns in each of which the number of shots is variably adjusted depending on the number of a plurality of non-resolution shots of a micro-size beam equivalent to an unresolved dose. In other words, the deflection region shape calculation unit 54 calculates, for each SF 30, the shape of the deflection region of the SF 30 concerned. Specifically, it operates as follows: The deflection region shape calculation unit 54 calculates a change amount $\Delta x$ in the x direction of the deflection region shape corresponding to the shot density of the SF 30 concerned, based on an approximate expression of the change amount $\Delta x$ in the x direction of the deflection region shape of the SF 30 depending on the shot density. Similarly, the deflection region shape calculation unit 54 calculates a change amount $\Delta y$ in the y direction of the deflection region shape corresponding to the shot density of the SF 30 concerned, based on an approximate expression of the change amount $\Delta y$ in the y direction of the deflection region shape of the SF 30 depending on the shot density. Similarly, the deflection region shape calculation unit 54 calculates a rotation change amount $\Delta\theta x$ of the x axis of the deflection region shape corresponding to the shot density of the SF 30 concerned, based on an approximate expression of the rotation change amount $\Delta\theta x$ of the x axis of the deflection region shape of the SF 30 depending on the shot density. Similarly, the deflection region shape calculation unit 54 calculates a rotation change amount $\Delta\theta y$ of the y axis of the deflection region shape corresponding to the shot density of the SF 30 concerned, based on an approximate expression of the rotation change amount $\Delta\theta y$ of the y axis of the deflection region shape of the SF 30 depending on the shot density. The calculation results are output to the deflection control circuit 130.

Moreover, the deflection region shape calculation unit 54 calculates a deflection region shape of a temporary main deflection region 22 concerned, for each temporary main deflection region 22 obtained by dividing the stripe region 20. The calculation method is the same as that with respect to the SF 30. Thereby, it is possible to obtain a change amount $\Delta x$ in the x direction, a change amount $\Delta y$ in the y direction, a rotation change amount $\Delta\theta x$ of the x axis, and a rotation change amount $\Delta\theta y$ of the y axis of the main deflection region shape corresponding to the shot density of the temporary main deflection region 22 concerned. The calculation results are output to the deflection control circuit 130.

Thus, the deflection region shape calculation unit 54 calculates a deflection region shape with respect to each of a plurality of deflection regions having different sizes.

Based on the preprocessing described above, a circuit pattern defined in the writing data is actually written on the target object 101.

In the shot data generation step (S200), the shot data generation unit 60 reads out writing data from the storage device 140, and performs data processing of several steps so as to divide a figure pattern into a plurality of shot figures by the size that can be irradiated by one shot of the electron beam 200, for each figure pattern defined in each figure pattern data defined in the read writing data. Then, the shot data generation unit 60 generates shot data defining the figure type, coordinates (deflection position), and the size of each shot figure. Further, an irradiation time may be defined in the shot data. The writing data is preferably read by the unit of the stripe region. The generated shot data is rearranged in the order of shots, and temporarily stored in the storage device 144.

In the deflection position correcting step (S202), first, the deflection control circuit 130 receives shot data transmitted from the storage device 144. Then, the deflection position correcting unit 132 corrects the deflection position of the electron beam 200 to be shot in the deflection region concerned, according to the number of shots (shot density) to be shot in the deflection region. Specifically, it operates as follows: The deflection position correcting unit 132 specifies, for each shot figure, an SF 30 corresponding to the deflection position defined in the shot data. Then, the deflection position correcting unit 132 corrects the deflection position (sub deflection position) of the shot figure defined in the shot data concerned, using change amount data on the deflection region shape in the SF 30 concerned. The change amount data of the shape of the deflection region in SF 30 specifies only deflection region shape (outer frame). Therefore, the deflection position of the shot figure in the SF 30 should be linearly interpolated depending on the deflection position in the SF 30, using the change amount of the deflection region shape (outer frame) of the SF 30. Then, correction can be achieved by shifting coordinates in the direction to correct the deviation amount. Moreover, it is possible to specify the position of the SF 30 concerned in the main deflection region 22 in the case of being deflected to the reference position A of the SF 30 concerned by the main deflector 208, based on a writing sequence controlled by the writing control circuit 62. Therefore, in temporary main deflection regions 22 for each of which the shot density has been calculated, the deflection position (main deflection position) indicating the reference position A of the SF 30 concerned is corrected by using the change amount data of the deflection region shape of the temporary main deflection region 22 where the SF 30 concerned is arranged. Even in such a case, the change amount of the deflection region shape (outer frame) of the temporary main deflection region 22 should be linearly interpolated based on the position of the SF 30 concerned in the main deflection region 22 to be actually written. Then, correction can be achieved by shifting coordinates in the direction to correct the deviation amount.

Since the main deflection region 22 varies each moment with advancement of writing, it is also preferable to newly calculate the shot density of the main deflection region 22 concerned at the time of writing the shot figure defined in the shot data concerned, based on the writing sequence controlled by the writing control circuit 62, and to obtain change amount data of the deflection region shape of the main deflection region 22 concerned corresponding to the new shot density. Then, the main deflection position may be corrected in real time based on the change amount data of the deflection region shape of the main deflection region 22 concerned.

In the writing step (S204), first, the deflection amount calculating unit 134 calculates a deflection amount for deflecting the electron beam 200 by the main deflector 208 to the deflection position (main deflection position) which indicates the reference position A of the SF 30 concerned and has been corrected based on the shot density. Similarly, the deflection amount calculating unit 134 calculates a deflection amount for deflecting the electron beam 200 by the sub deflector 209 to the deflection position (sub deflection position) of the shot figure defined in the shot data concerned, which has been corrected based on the shot density. Moreover, a deflection amount for blanking control and a deflection amount for shaping control are also calculated. Then, each data of the deflection amounts is output to a corresponding DAC amplifier. The writing mechanism 150 performs operations described above so as to write the shot figure on the target object 101. Specifically, each of the main deflector 208 and the sub deflector 209 deflects the electron beam 200 to the corrected deflection position on the surface of the target object 101. By performing such operations for each shot figure, the writing mechanism 150 writes a pattern on the target object 101.

As described above, at the stage of preprocessing before generating shot data, the deflection region shape calculation unit 54 calculates the deflection region shape of the deflection region concerned according to the number of shots to be shot in the deflection region concerned. By this operation, no calculation processing is performed when actually executing writing processing, and therefore, throughput reduction can be avoided.

As described above, according to the first embodiment, it is possible to perform writing in consideration of influence of the number of shots on the shape of the deflection region. Accordingly, highly precise writing can be performed.

Second Embodiment

Although, in the first embodiment, it is described with respect to a single beam writing apparatus in the case where a deflection position is corrected based on the amount of change of the deflection region shape depending on the number of shots, it is not limited thereto. In a second embodiment, it will be described with respect to a multi-beam writing apparatus where correction based on the amount of change of the region shape is employed.

Figure 9:
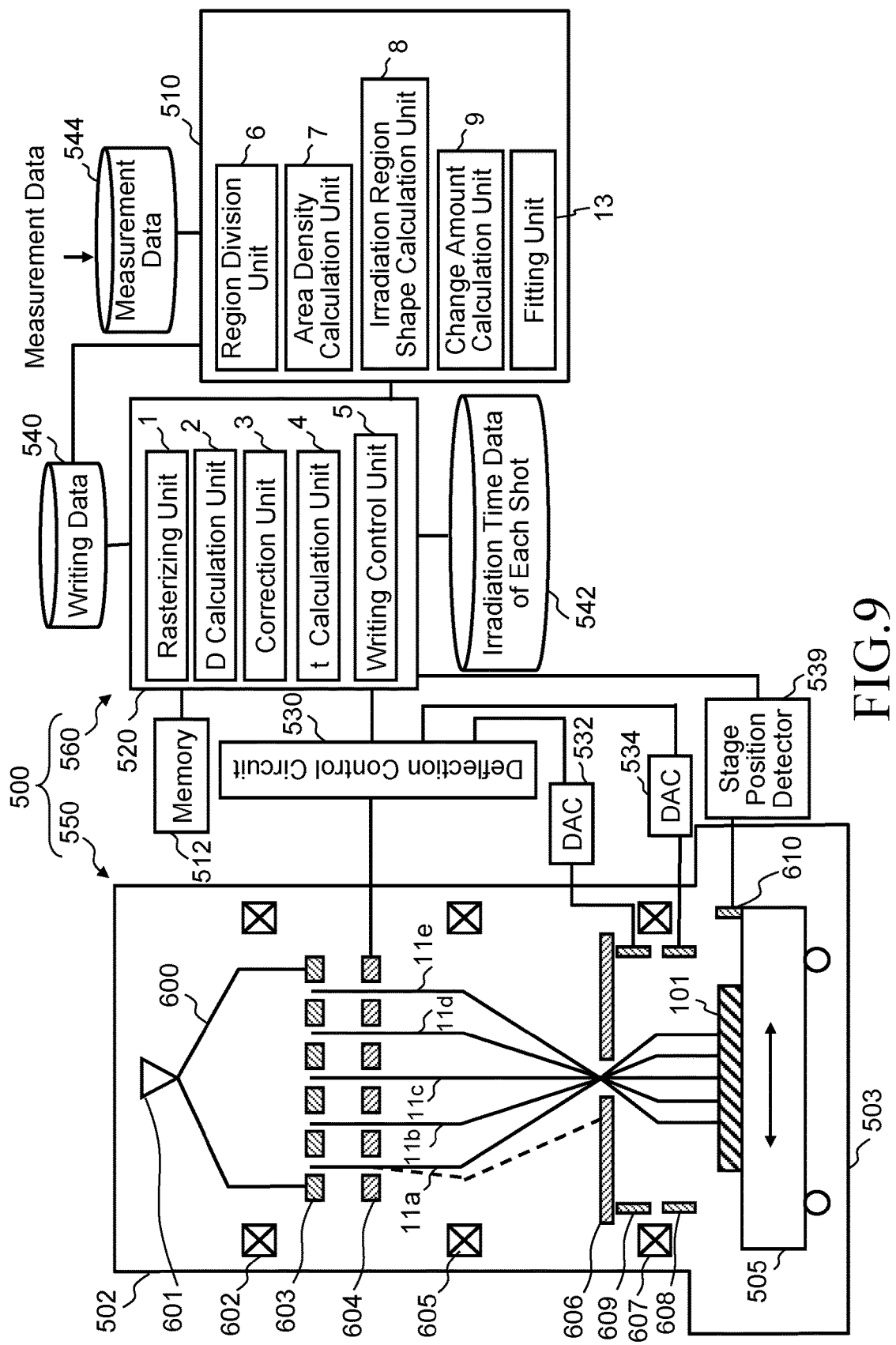
FIG. 9 is a schematic diagram showing a configuration of a writing apparatus according to a second embodiment.

FIG. 9 is a schematic diagram showing a configuration of a writing apparatus according to the second embodiment. As shown in FIG. 9, a writing apparatus 500 includes a writing mechanism 550 and a control system circuit 560. The writing apparatus 500 is an example of a multi charged particle beam writing apparatus. The writing mechanism 550 includes an electron optical column 502 (multi electron beam column) and a writing chamber 503. In the electron optical column 502, there are arranged an electron gun 601, an illumination lens 602, a shaping aperture array substrate 603, a blanking aperture array mechanism 604, a reducing lens 605, a limiting aperture substrate 606, an objective lens 607, a deflector 608, and a deflector 609. In the writing chamber 503, there is arranged an XY stage 505. On the XY stage 505, a target object or "sample" 101 such as a mask blank on which resist is applied, serving as a writing target substrate, is placed when writing is performed. The target object 101 is, for example, an exposure mask used for fabricating semiconductor devices, or a semiconductor substrate (silicon wafer) for fabricating semiconductor devices. Moreover, a mirror 610 for measuring the position of the XY stage 505 is arranged on the XY stage 505.

The control system circuit 560 includes control computers 510 and 520, a memory 512, a deflection control circuit 530, DAC (digital-analog converter) amplifier units 532 and 534, a stage position detector 539, and storage devices 540, 542, and 544 such as magnetic disk drives. The control computers 510 and 520, the memory 512, the deflection control circuit 530, the stage position detector 539, and the storage devices 540, 542 and 544 are connected with each other through a bus (not shown). The DAC amplifier units 532 and 534, and the blanking aperture array mechanism 604 are connected to the deflection control circuit 530. Outputs of the DAC amplifier unit 532 are connected to the deflector 609. Outputs of the DAC amplifier unit 534 are connected to the deflector 608. The stage position detector 539 irradiates the mirror 610 on the XY stage 505 with a laser beam, and receives a reflected light from the mirror 610. Then, the stage position detector 539 measures the position of the XY stage 505 by using information on the reflected light.

In the control computer 510, there are arranged a region division unit 6, an area density calculation unit 7, an irradiation region shape calculation unit 8, a change amount calculation unit 9, and a fitting unit 13. Each of the " . . . units" such as the region division unit 6, the area density calculation unit 7, the irradiation region shape calculation unit 8, the change amount calculation unit 9, and the fitting unit 13 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Data which is input and output to/from the region division unit 6, the area density calculation unit 7, the irradiation region shape calculation unit 8, the change amount calculation unit 9, and the fitting unit 13, and data being operated are stored in a memory (not shown) each time.

In the control computer 510, there are arranged a rasterizing unit 1, a dose D calculation unit 2, a correction unit 3, an irradiation time t calculation unit 4, and a writing control unit 5. Each of the " . . . units" such as the rasterizing unit 1, the dose D calculation unit 2, the correction unit 3, the irradiation time t calculation unit 4, and the writing control unit 5 includes a processing circuitry. As the processing circuitry, for example, an electric circuit, computer, processor, circuit board, quantum circuit, or semiconductor device can be used. Each " . . . unit" may use a common processing circuitry (same processing circuitry), or different processing circuitries (separate processing circuitries). Data which is input and output to/from the rasterizing unit 1, the dose D calculation unit 2, the correction unit 3, the irradiation time t calculation unit 4, and the writing control unit 5, and data being operated are stored in the memory 512 each time.

Moreover, writing data is input from the outside of the writing apparatus 500, and stored in the storage device 540. The writing data usually defines information on a plurality of figure patterns to be written. Specifically, it defines a figure code, coordinates, size, etc. for each figure pattern.

FIG. 9 shows configuration elements necessary for describing the second embodiment. It should be understood that other configuration elements generally necessary for the writing apparatus 500 may also be included therein.

Figure 10:
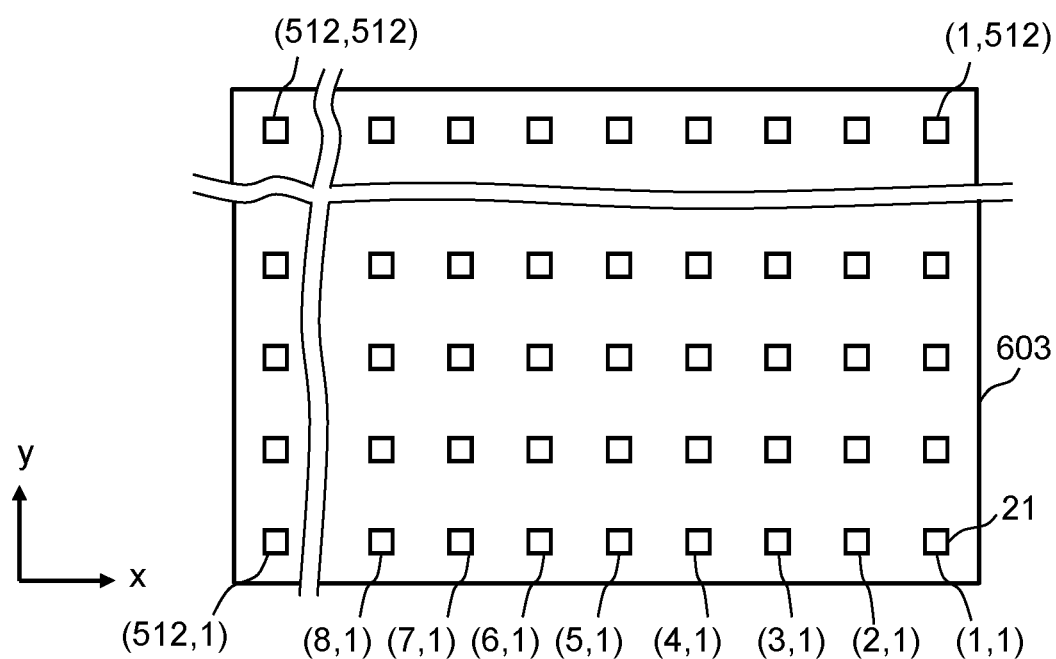
FIG. 10 is a conceptual diagram showing a configuration of a shaping aperture array substrate according to the second embodiment.

FIG. 10 is a conceptual diagram showing a configuration of a shaping aperture array substrate according to the second embodiment. As shown in FIG. 10, holes (openings) 21 of p rows long (length in the y direction) and q columns wide (width in the x direction) (p≥2, q≥2) are formed, like a matrix, at a predetermined arrangement pitch in the shaping aperture array substrate 603. In FIG. 10, for example, holes 21 of 512 (rows of holes arrayed in the y direction)×512 (columns of holes arrayed in the x direction) are formed. Each of the holes 21 is a quadrangle having the same dimension, shape, and size. Alternatively, each of the holes 21 may be a circle with the same diameter. Multi-beams 11 are formed by letting portions of an electron beam 600 individually pass through a corresponding hole of a plurality of holes 21.

The electron beam 600 emitted from the electron gun 601 (emission source) almost perpendicularly (e.g., vertically) illuminates the whole of the shaping aperture array substrate 603 by the illumination lens 602. A plurality of quadrangular holes (openings) 21 are formed in the shaping aperture array substrate 603. The region including all the plurality of holes 21 is irradiated by the electron beam 600. For example, a plurality of quadrangular electron beams (multi-beams) 11a to 11e are formed by letting portions of the electron beam 600, which irradiates the positions of a plurality of holes 21, individually pass through a corresponding one of the plurality of holes 21 of the shaping aperture array substrate 603. The multi-beams 11a to 11e individually pass through a corresponding one of blankers (first deflector: individual blanking mechanism) of the blanking aperture array mechanism 604.

In the blanking aperture array mechanism 604, there is arranged a substrate where passage holes (openings), through each of which a corresponding one of multi-beams passes, are formed at positions each corresponding to each hole 21 of the shaping aperture array substrate 603. Then, with respect to each passage hole, a plurality of electrode pairs each composed of a control electrode and a counter electrode (blanker: blanking deflector) are arranged such that the electrodes are opposite each other across the corresponding passage hole. Each blanker deflects (provides blanking deflection) a corresponding one of the multi-beams 11 which individually pass through corresponding blankers.

The multi-beams 11a to 11e having passed through the blanking aperture array mechanism 604 are reduced by the reducing lens 605, and go toward the hole in the center of the limiting aperture substrate 606. At this stage, the electron beam 11 which was deflected by the blanker of the blanking aperture array mechanism 604 deviates (shifts) from the hole in the center of the limiting aperture substrate 606 and is blocked by the limiting aperture substrate 606. On the other hand, the electron beam 11 which was not deflected by the blanker of the blanking aperture array mechanism 604 passes through the hole in the center of the limiting aperture substrate 606. In such a way, blanking control is provided by ON/OFF of the individual blanking mechanism so as to control ON/OFF of beams. Thus, the limiting aperture substrate 606 blocks each beam which was deflected to be in an OFF condition by the individual blanking mechanism. Then, one shot of multi-beams is formed by beams each of which has been made during a period from becoming beam ON to becoming beam OFF and has passed through the limiting aperture substrate 606. The multi-beams 11 having passed through the limiting aperture substrate 606 are focused by the objective lens 607 to be a pattern image of a desired reduction ratio. Then, respective beams (the whole of the multi-beams 11) having passed through the limiting aperture substrate 606 are collectively deflected in the same direction by the deflectors 608 and 609 in order to irradiate respective beam irradiation positions on the target object 101. Ideally, the multi-beams 11 irradiating at a time are aligned at pitches obtained by multiplying the arrangement pitch of a plurality of holes of the shaping aperture array substrate 603 by a desired reduction ratio described above.

A plurality of shot patterns up to as many as the number of the holes 21 are formed at a time by one shot of multi-beams having been formed by passing through the holes 21 in the shaping aperture array substrate 603. Therefore, with respect to the region size that can be irradiated with one irradiation of the multi-beams 11, its size in the x direction is obtained by multiplying the pitch between beams in the x direction on the surface of the target object 101 by the number of beams arranged in the x direction, and its size in the y direction is obtained by multiplying the pitch between beams in the y direction by the number of beams arranged in the y direction. Thus, the quadrangular region defined by the x direction size and the y direction size is an irradiation region irradiatable by one irradiation of the multi-beams 11.

Figure 11:
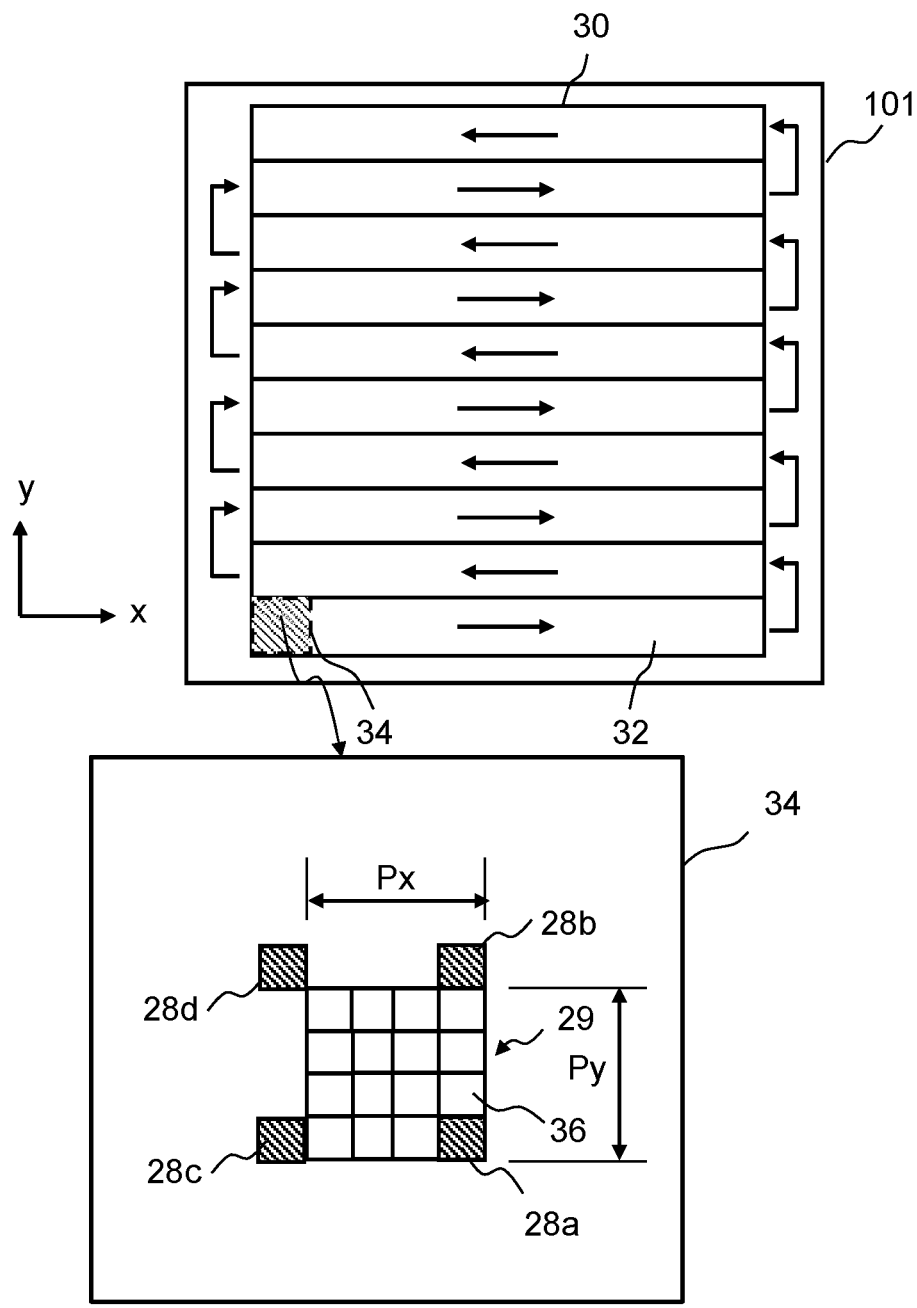
FIG. 11 is a conceptual diagram explaining an example of a writing operation according to the second embodiment.

FIG. 11 is a conceptual diagram explaining an example of a writing operation according to the second embodiment. As shown in FIG. 11, a writing region 30 of the target object 101 is virtually divided by a predetermined width in the y direction into a plurality of strip-shaped stripe regions 32, for example. First, the XY stage 505 is moved to make an adjustment such that an irradiation region 34 which can be irradiated with one shot of the multi-beams 20 is located at the left end of the first stripe region 32 or at a position more left than the left end, and then writing is started. When writing the first stripe region 32, the XY stage 505 is moved, for example, in the −x direction, so that the writing advances relatively in the x direction. The XY stage 505 is moved, for example, continuously at a constant speed. After writing the first stripe region 32, the stage position is moved in the −y direction to make an adjustment such that the irradiation region 34 is located at the right end of the second stripe region 32 or at a position more right than the right end and located relatively in the y direction. Then, by moving the XY stage 505 in the x direction, for example, writing similarly advances in the −x direction. That is, writing is performed while alternately changing the direction, such as performing writing in the x direction in the third stripe region 32, and in the −x direction in the fourth stripe region 32, thereby reducing the writing time. However, the writing operation is not limited to writing while alternately changing the direction, and it is also preferable to perform writing in the same direction when writing each stripe region 32.

The stripe region 32 is divided into a plurality of mesh-like pixels 36 (unit irradiation region, irradiation position, or writing position) by the beam size of each of the multi-beams, for example. FIG. 11 shows the case where the writing region of the target object 101 is divided, for example, in the y direction, into a plurality of stripe regions 32 by the width size being substantially the same as the size of the irradiation region 34 (writing field) which can be irradiated with one irradiation of the multi-beams 11. The width of the stripe region 32 is not limited thereto. In the example of FIG. 11, there are shown a part (irradiation positions of the four beams 28a to 28d) of a plurality of pixels 28 (beam writing positions) which can be irradiated with one shot of the multi-beams 11, in a plurality of pixels 36 located in the irradiation region 34. The reduction scale of the irradiation region 34 and that of the pixel 36 are not coincident. In other words, the pitch between the adjacent pixels 28 in the x direction is pitch Px between beams of the multi-beams, and the pitch between the adjacent pixels 28 in the y direction is pitch Py between beams of the multi-beams. In the example of FIG. 11, one sub irradiation region 29 is configured by a square region surrounded by four adjacent pixels 28a to 28d and including one pixel 28a of the four pixels 28a to 28d. In the case of FIG. 11, each sub irradiation region 29 is composed of 4×4 pixels 36.

In multi-beam writing, since the irradiation region 34 deviates (shifts) on the surface of the target object 101 along with movement of the XY stage 505, the deflector 608 performs deflection such that the irradiation region 34 follows the movement of the XY stage 505. Then, while the irradiation region 34 is relatively fixed on the surface of the target object 101 by the deflector 608, the irradiation position of each beam is moved per pixel 36 in the pitch between beams by collective deflection of the whole of the multi-beams 11 within the range of the pitch Px between beams in the x direction and the pitch Py between beams in the y direction by the deflector 609. By repeating this operation, the whole surface of each sub irradiation region 29 is written, and thus, the whole surface of the target object will be irradiated. With respect to each sub irradiation region 29, all the pixels 36 inside it may be written with one corresponding beam, or all the pixels 36 inside it may be written with a plurality of different beams.

For writing a pattern, all the pixels 36 located in the irradiation region 34 are not irradiated with beams, but the pixels at the positions corresponding to the pattern are irradiated with beams. Therefore, densities of shots are different depending on the area density of a pattern with respect to each irradiation region 34 in the stripe region 32. Therefore, there is concern about deviation of the irradiation position of the multi-beams 11 resulting from such shot densities. In other words, there is concern about deformation of the shape of the irradiation region 34 of the multi-beams 11. Then, according to the second embodiment, the amount of change of the irradiation region shape of the multi-beams 11 is measured in order to correct the irradiation position of each beam. It will be specifically described hereinafter.

Figure 12A:
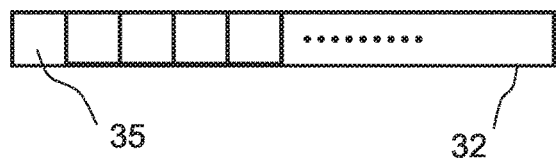

FIGS. 12A to 12D show examples of a processing region and an evaluation pattern corresponding to an irradiation region according to the second embodiment. As shown in FIG. 12A, in the second embodiment, each stripe region 32 is divided into a plurality of processing regions 35 each having the same size as that of the irradiation region 34. Then, the irradiation position of each beam is corrected depending on the pattern area density of each processing region 35. Therefore, first, an evaluation pattern is written on the evaluation substrate coated with resist. FIGS. 12B to 12D show the cases where 9×9 multi-beams are used, for example. With respect to evaluation patterns, multi-beam shots of different pattern area densities are individually sent to three processing regions 35 each having the same size as that of the irradiation region 34, and then, the amount of change of the irradiation region shape of the multi-beams 11 in each case is measured. Here, multi-beam shots whose pattern area densities are 0%, 50%, and 500% are performed, and the amount of change of the irradiation region shape of the multi-beams 11 in each case is measured. Therefore, in the examples of FIGS. 12B to 12D, deviation (shift) of the irradiation positions of 3×3 beams which include a center beam and beams at the four corners in the 9×9 multi-beams is measured. If using only one pixel 36 irradiated by one beam, it is difficult to measure the position of a pattern formed in the pixel concerned by a dimension measuring instrument because the size is too small. Then, the position of an evaluation pattern pattern 15 formed having the size of the sub irradiation region 29 irradiated by each beam is measured. Therefore, in the cases of FIGS. 12B to 12D, since each sub irradiation region 29 is composed of 4×4 pixels, sixteen times of multi-beam shots are performed shifting a pixel to be irradiated, in order to form the evaluation pattern pattern 15.

FIG. 12B shows an example of an evaluation pattern in the state where the pattern area density is 0%. Here, 3×3 evaluation figure patterns 15 each having the size (e.g., 0.2 µm or more) measurable by the pattern position measuring instrument are arranged in the processing region 35, and nothing is written in the other sub irradiation regions 29 in the processing region 35. Thereby, a pattern area density of approximate 0% can be obtained. Naturally, only the evaluation figure patterns 15 remain after the development. Then, the position of each evaluation figure pattern 15 is measured. In this way, it is possible to measure the positions of the evaluation figure patterns 15 when performing writing in the state where the pattern area density is 0%.

FIG. 12C shows an example of an evaluation pattern in the state where the pattern area density is 50%. Similarly to FIG. 12B, 3×3 evaluation figure patterns 15 are arranged in the processing region 35. Moreover, sub-patterns 17 are arranged in half the number of the other irradiation regions 29 in the processing region 35. In such a state, if the sub-pattern 17 is arranged in the sub irradiation region 29 adjacent to the 3×3 evaluation figure patterns 15 which are arranged in the x direction and the y direction, the evaluation figure pattern 15 and the sub-pattern 17 make contact with each other, thereby becoming difficult to measure the edge position of the evaluation figure pattern 15. Therefore, it is preferable not to arrange the sub-patterns 17 in the sub irradiation regions 29 adjacent to the 3×3 evaluation figure patterns 15 with respect to the x direction and the y direction. It is also preferable to arrange the sub-pattern 17 in every other sub irradiation region 29 in the other sub irradiation regions 29 in the processing region 35 so that the arrangement positions of the sub-patterns 17 may not be unevenly distributed. Naturally, the evaluation figure patterns 15 and the sub-patterns 17 remain after the development. Then, the position of each evaluation figure pattern 15 is measured. In this way, it is possible to measure the positions of the evaluation figure patterns 15 when performing writing in the state where the pattern area density is 50%.

FIG. 12D shows an example of an evaluation pattern in the state where the pattern area density is 100%. Similarly to FIG. 12B, 3×3 evaluation figure patterns 15 are arranged in the processing region 35. Moreover, sub-patterns 17 are arranged in the other irradiation regions 29 in the processing region 35. In such a state, the sub-patterns 17 are not arranged in the sub irradiation regions 29 adjacent to the 3×3 evaluation figure patterns 15 with respect to the x direction and the y direction. Naturally, the evaluation figure patterns 15 and the sub-patterns 17 remain after the development. Then, the position of each evaluation figure pattern 15 is measured. In this way, it is possible to measure the positions of the evaluation figure patterns 15 when performing writing in the state where the pattern area density is 100%.

Measured data as described above is input from the outside of the writing apparatus 500, and stored in the storage device 544.

By the process described above, it is possible to obtain measurement data for specifying the irradiation region shape of the irradiation regions 34 of the multi-beams 11 in each of pattern area densities of 100%, 50%, and 0%.

In the shape change amount calculation step with respect to an irradiation region, the change amount calculation unit 9 calculates a change amount of the shape of the irradiation region of the multi-beams 11 in each of pattern area densities, using a measurement result.

Figure 13:
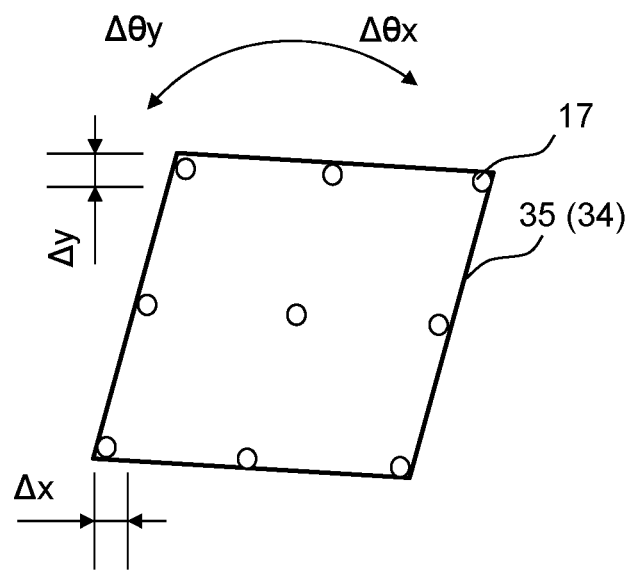
FIG. 13 shows an example of an irradiation region shape according to the second embodiment.

FIG. 13 shows an example of an irradiation region shape according to the second embodiment. 3×3 irradiation positions 17 including the four corners of the processing region 35 can be known from measurement results for each of pattern area densities of 100%, 50%, and 0%. Based on measured data in the state of the pattern area density being 100%, the change amount calculation unit 9 calculates a change amount $\Delta x$ in the x direction, a change amount $\Delta y$ in the y direction, a rotation change amount $\Delta \theta x$ of the x axis, and a rotation change amount $\Delta \theta y$ of the y axis of the irradiation region shape of the irradiation region 34 of the multi-beams 11 in the state of the pattern area density being 100%. Similarly, based on measured data in the state of the pattern area density being 50%, the change amount calculation unit 9 calculates a change amount $\Delta x$ in the x direction, a change amount $\Delta y$ in the y direction, a rotation change amount $\Delta \theta x$ of the x axis, and a rotation change amount $\Delta \theta y$ of the y axis of the irradiation region shape of the irradiation region 34 of the multi-beams 11 in the state of the pattern area density being 50%. Similarly, based on measured data in the state of the pattern area density being 0%, the change amount calculation unit 9 calculates a change amount $\Delta x$ in the x direction, a change amount $\Delta y$ in the y direction, a rotation change amount $\Delta \theta x$ of the x axis, and a rotation change amount $\Delta \theta y$ of the y axis of the irradiation region shape of the irradiation region 34 of the multi-beams 11 in the state of the pattern area density being 0%.

In the fitting step, the fitting unit 13 calculates, for each of the change amounts of each irradiation region shape, an approximate expression depending on the pattern area density by fitting measurement results of the cases of three pattern area densities of 100%, 50%, and 0%.

Figure 14:
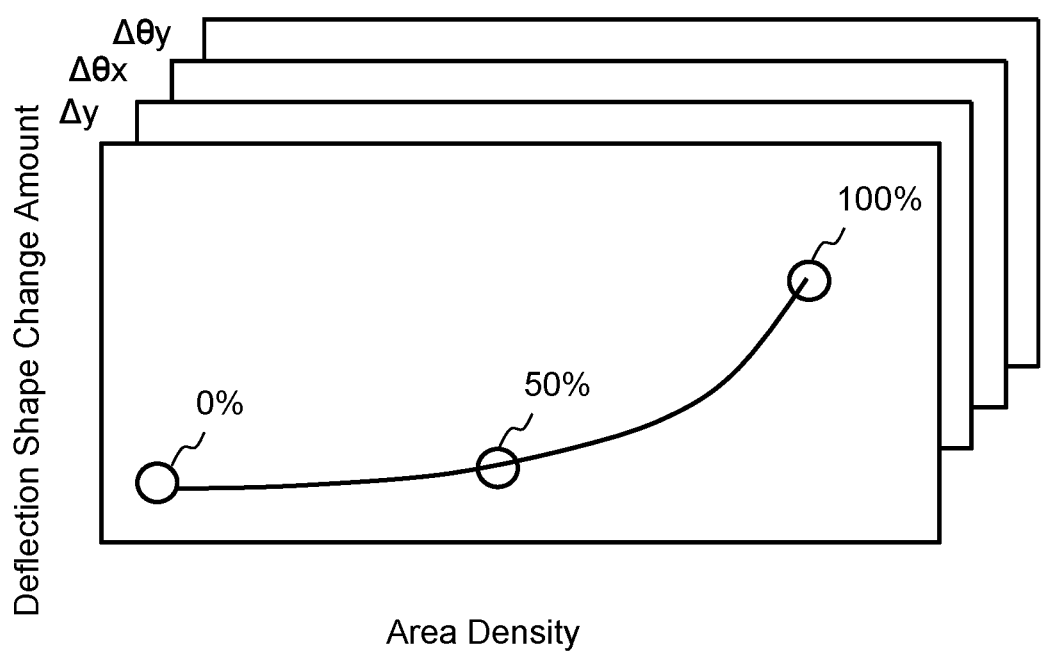
FIG. 14 shows an example of a relation between a pattern area density and a change amount of an irradiation region shape according to the second embodiment.

FIG. 14 shows an example of the relation between a pattern area density and a change amount of an irradiation region shape according to the second embodiment. In FIG. 14, the abscissa represents pattern area density, and the ordinate represents change amount of an irradiation region shape. For example, FIG. 14 shows a change amount $\Delta x$ in the x direction of the irradiation region shape. The fitting unit 13 calculates an approximate expression of a change amount $\Delta x$ in the x direction of the irradiation region shape of the irradiation region 34 depending on the pattern area density by fitting measurement points of the cases of the three pattern area densities of 100%, 50%, and 0%. Similarly, the fitting unit 13 calculates an approximate expression of a change amount $\Delta y$ in the y direction of the irradiation region shape of the irradiation region 34 depending on the pattern area density. Similarly, the fitting unit 13 calculates an approximate expression of a rotation change amount $\Delta \theta x$ of the x axis of the irradiation region shape of the irradiation region 34 depending on the pattern area density of the irradiation region shape of the irradiation region 34. Similarly, the fitting unit 13 calculates an approximate expression of a rotation change amount $\Delta \theta y$ of the y axis of the irradiation region shape of the irradiation region 34 depending on the pattern area density.

The shape of the irradiation region in the case of actually writing a circuit pattern on the target object 101 is obtained based on these approximate expressions showing change amounts of the irradiation region shape depending on the pattern area density. There will be described preprocessing in the writing apparatus 500.

In the region dividing step, the region division unit 6 divides each stripe region 32 (writing region of target object) into a plurality of processing regions 35 by the size of the irradiation region 34 that can be irradiated by one shot of the multi-beams 11. In other word, the region division unit 6 divides each stripe region 32 (writing region of target object) into a plurality of processing regions 35 by the size of the irradiation region 34 that can be irradiated with the whole multi-beams 11.

In the area density calculation step, the area density calculation unit 7 reads writing data from the storage device 540 to calculate the area density of a pattern arranged in each processing region 35.

In the irradiation region shape calculation step, the irradiation region shape calculation unit 8 calculates the irradiation region shape of the irradiation region 34, depending on the pattern area density. Specifically, it operates as follows: The irradiation region shape calculation unit 8 calculates a change amount $\Delta x$ in the x direction of the irradiation region shape corresponding to the pattern area density of the processing region 35 concerned, based on an approximate expression of the change amount $\Delta x$ in the x direction of the irradiation region shape of the irradiation region 34 depending on the pattern area density. Similarly, the irradiation region shape calculation unit 8 calculates a change amount $\Delta y$ in the y direction of the irradiation region shape corresponding to the pattern area density of the processing region 35 concerned. Similarly, the irradiation region shape calculation unit 8 calculates a rotation change amount $\Delta \theta x$ of the x axis of the irradiation region shape corresponding to the pattern area density of the processing region 35 concerned. Similarly, the irradiation region shape calculation unit 8 calculates a rotation change amount $\Delta \theta y$ of the y axis of the irradiation region shape corresponding to the pattern area density of the processing region 35 concerned. The calculation results are output to the control computer 120.

Based on the preprocessing described above, a circuit pattern defined in the writing data is actually written on the target object 101.

In the rasterizing step, the rasterizing unit 1 reads writing data from the storage device 540, and calculates, for each pixel 36, a pattern area density $\rho'$ in the pixel 36 concerned. This processing is performed for each stripe region 32, for example.

In the dose calculation step, the dose D calculation unit 2 calculates, for each pixel 36, an incident dose D(x) with which the pixel 36 concerned is irradiated. The incident dose D(x) can be calculated by multiplying a pre-set base dose $D_{base}$, a proximity effect correction irradiation coefficient $D_p$, and a pattern area density ρ', for example. The base dose $D_{base}$ can be defined by Dth/(½+η), for example. Thereby, it is possible to obtain an originally desired dose D, for which the proximity effect has been corrected, based on layout of a plurality of figure patterns defined by the writing data. The proximity effect correction irradiation coefficient $D_p$ can be defined by a threshold value model for proximity effect correction, which is the same as the one used in a conventional method where a backscatter coefficient η, a dose threshold value Dth of a threshold value model, a pattern area density ρ, and a distribution function g(x) are used.

In the correcting step, the correction unit 3 corrects the incident dose D(x) (dose amount) of a beam which causes a position deviation, using the amount of change of the irradiation region shape of the multi-beams 11 in the processing region 35 concerned which is produced depending on the pattern area density of each processing region 35. Specifically, it operates as follows: The correction unit 3 specifies the processing region 35 to be written. Then, the correction unit 3 corrects the irradiation position of the multi-beams 11 to write the processing region concerned, using change amount data on the irradiation region shape of the irradiation region 34 in the processing region 35 concerned. The change amount data of the shape of the irradiation region 34 specifies only the irradiation region shape (outer frame) of the irradiation region 34. Therefore, the irradiation position of each beam in the irradiation region 34 can be obtained by a linear interpolation of the change amount of the irradiation region shape (outer frame) of the irradiation region 34. Then, correction can be achieved by shifting the irradiation position of a beam, in the direction to correct the deviation amount.

However, with respect to the multi-beams 11, since the whole of the multi-beams 11 is collectively deflected, it is impossible to individually correct the deflection position of each beam. Then, the position of a pixel pattern formed at the beam irradiation position is shifted by distributing a part or the whole of the incident dose D(x) (dose amount) to surrounding pixels 36 which correspond to irradiation positions of respective beams.

FIGS. 15A and 15B illustrate an example of a method of correcting a positional deviation according to the second embodiment. FIG. 15A shows the case where a beam "a'" irradiating the pixel 36 at coordinates (x, y) deviates in the +x and +y directions. In order to correct the deviated position of the pattern formed by the beam "a'" with such positional deviation to the position corresponding to the pixel at coordinates (x, y) as shown in FIG. 15B, the correction can be accomplished by distributing the dose amount corresponding to the deviated position to a pixel located opposite to the direction of the deviated peripheral pixels. In the example of FIG. 15A, the dose amount corresponding to the deviated position having been displaced (shifted) to the pixel at coordinates (x, y+1) should be distributed to the pixel at coordinates (x, y−1). The dose amount corresponding to the deviated position having been displaced to the pixel at coordinates (x+1, y) should be distributed to the pixel at coordinates (x−1, y). The dose amount corresponding to the deviated position having been displaced to the pixel at coordinates (x+1, y+1) should be distributed to the pixel at coordinates (x−1, y−1).

In proportion to the ratio of the area displaced due to positional deviation of the beam irradiating the pixel (x, y) concerned, the correction unit 3 calculates a modulation rate of the beam irradiating the pixel (x, y) concerned, and modulation rates of the beams irradiating its peripheral surrounding pixels at (x, y−1), (x−1, y), and (x−1, y−1). Specifically, for each peripheral surrounding pixel where a part of beams are overlapped due to beam deviation, the ratio obtained by dividing the deviated area (area of beam overlapping portion) by the beam area is calculated as an amount of distribution (beam modulation rate) to a pixel located opposite to the overlapping pixel.

In the case of FIG. 15A, the area ratio of the portion shifted (displaced) to the pixel at coordinates (x, y+1) can be calculated by ("beam size in x direction"−"deviation amount in x direction")×"deviation amount in y direction"/("beam size in x direction"×"beam size in y direction"). Therefore, a distribution amount (beam modulation rate) A to be distributed for correction to the pixel at coordinates (x, y−1) can be calculated by ("beam size in x direction"−"deviation amount in x direction")×"deviation amount in y direction"/("beam size in x direction"×"beam size in y direction").

Also, in the case of FIG. 15A, the area ratio of the portion shifted (displaced) to the pixel at coordinates (x+1, y+1) can be calculated by "deviation amount in x direction"×"deviation amount in y direction"/("beam size in x direction"×"beam size in y direction"). Therefore, a distribution amount (beam modulation rate) B to be distributed for correction to the pixel at coordinates (x−1, y−1) can be calculated by "deviation amount in x direction"×"deviation amount in y direction"/("beam size in x direction"×"beam size in y direction").

Also, in the case of FIG. 15A, the area ratio of the portion shifted (displaced) to the pixel at coordinates (x+1, y) can be calculated by "deviation amount in x direction"× ("beam size in y direction"−"deviation amount in y direction"/ ("beam size in x direction"×"beam size in y direction"). Therefore, a distribution amount (beam modulation rate) C to be distributed for correction to the pixel at coordinates (x−1, y) can be calculated by "deviation amount in x direction"× ("beam size in y direction"−"deviation amount in y direction"/("beam size in x direction"×"beam size in y direction").

Consequently, a modulation rate D of the beam irradiating the pixel at coordinates (x, y), which remains without being distributed, can be calculated by 1-A-B-C.

The correction unit 3 performs irradiation modulation/adjustment of each pixel 36 by multiplying the incident dose D(x) of a corresponding pixel by the obtained modulation rate. Thereby, the incident dose D(x) (dose amount) of the beam which causes a position deviation can be corrected.

In the irradiation time calculation step, the irradiation time t calculation unit 4 calculates an irradiation time t of a beam to irradiate the pixel concerned by dividing the incident dose D(x) defined for each pixel 36 by a current density J.

In the writing step, first, the writing control unit 5 rearranges the irradiation time data defined for the pixel concerned in order of shot, and transmits them to the deflection control circuit 530. Then, along with deflection data output to the blanking aperture array mechanism 604, and the deflectors 608 and 609 from the deflection control circuit 530, the writing mechanism 550 writes a desired pattern by irradiating the processing region 35 concerned on the surface of the target object 101 with the multi-beams 11 of the corrected dose.

In the example described above, all the pixels 36 in a predetermined processing region 35 are written in the state where, while the XY stage 505 is moving, the irradiation region 34 is relatively fixed in the processing region 35 with following the movement of the XY stage 505 by the deflector 608, but it is not limited thereto. When the irradiation region 34 is moved after shortening the time of one tracking cycle during which the irradiation region 34 follows the movement of the XY stage 505 and writing a part of pixels 36 in the processing region 35, the pattern area density in the irradiation region 34 changes for each tracking cycle. In that case, it is also preferable to calculate the pattern density of the processing region 35 for each tracking cycle while regarding, for each tracking cycle, the region in which the irradiation region 34 is located as the processing region 35.

As described above, according to the second embodiment, it is possible to perform writing in consideration of influence of the pattern area density on the irradiation region shape of the irradiation region 34 of the multi-beams 11. Accordingly, a highly precise writing can be performed.

Embodiments have been explained referring to specific examples described above. However, the present invention is not limited to these specific examples. For example, in the above examples, the evaluation figure pattern 12 is arranged only at the center position of the processing region 35 in order to measure the shape of the irradiation region of the main irradiation region 21, but, it is not limited thereto. The evaluation figure pattern 12 may further be arranged at the position other than the center position of the processing region 35 as similarly to the above case of measuring the shape of the irradiation region of the processing region 35.

While the apparatus configuration, control method, and the like not directly necessary for explaining the present invention are not described, some or all of them can be selectively used case-by-case basis. For example, although description of the configuration of the control circuit for controlling the writing apparatus 500 is omitted, it should be understood that some or all of the configuration of the control circuit can be selected and used appropriately when necessary.

In addition, any other charged particle beam writing apparatus and method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
 a number of shots calculation circuit configured to calculate a number of shots in a case where a deflection region is irradiated with a shot of a charged particle beam;
 a deflection region shape calculation circuit configured to calculate a deflection region shape of the deflection region depending on the number of shots, wherein the deflection region shape is calculated using measurement data on writing positions of a plurality of evaluation patterns obtained by writing the plurality of evaluation patterns, in which the number of shots is varied by changing a number of a plurality of non-resolution shots of a micro-size beam equivalent to an unresolved dose;
 a deflection position correcting circuit configured to correct a deflection position of the charged particle beam to be shot in the deflection region, depending on the number of shots to be shot in the deflection region; and
 a deflector configured to deflect the charged particle beam to a corrected deflected position on a target object.

2. The apparatus according to claim 1, wherein
 the deflector is configured as a multiple stage deflector which multi-deflects a plurality of deflection regions having different sizes, and
 the deflection region shape calculation circuit calculates the deflection region shape of each of the plurality of deflection regions.

3. The apparatus according to claim 1 further comprising:
 a storage device configured to store writing data defining data on a figure pattern; and
 a shot data generation circuit configured to generate, using the writing data, shot data on a shot to be shot in the deflection region, wherein
 the deflection region shape calculation circuit calculates the deflection region shape of the deflection region, depending on the number of shots to be shot in the deflection region, at a stage of preprocessing before generating the shot data, and
 the deflection position correcting circuit corrects the deflection position of the shot of the charged particle beam defined by the shot data, based on a calculated deflection region shape depending on the number of shots.

4. The apparatus according to claim 1, wherein
 the deflector is configured by a multiple stage deflector having different deflection region sizes, and
 the deflection region shape calculation circuit calculates a deflection region shape of a first deflection region which is deflected by a first deflector, by using a shot density in the first deflection region, and calculates a deflection region shape of a second deflection region which is deflected by a second deflector, whose deflection region size is smaller than a deflection region size of the first deflector, by using a shot density in the second deflection region.

5. The apparatus according to claim 4, wherein
 the deflection position correcting circuit corrects a deflection position in the first deflection region which is deflected by the first deflector based on the deflection region shape of the first deflection region having been calculated using the shot density in the first deflection region, and corrects a deflection position in the second deflection region which is deflected by the second deflector based on the deflection region shape of the second deflection region having been calculated using the shot density in the second deflection region.

6. The apparatus according to claim 5, wherein first measurement data on writing positions of a plurality of first evaluation patterns obtained by writing the plurality of first evaluation patterns in which the shot density in the first deflection region is varied by changing the number of the plurality of non-resolution shots, and second measurement data on writing positions of a plurality of second evaluation patterns obtained by writing the plurality of second evaluation patterns in which the shot density in the second deflection region is varied by changing the number of the plurality of non-resolution shots are input from an outside of the writing apparatus, further comprising:

a storage device configured to store the first measurement data and the second measurement data which are input from the outside of the writing apparatus.

7. The apparatus according to claim 1, further comprising:
a change amount calculation circuit configured to calculate a change amount of the deflection region shape of the deflection region, for each shot density of a plurality of shot densities corresponding to the number of shots.

8. The apparatus according to claim 7, wherein the change amount of the deflection region shape of the deflection region is calculated using the measurement data on the writing positions of the plurality of the evaluation patterns.

9. A charged particle beam writing method comprising:
calculating a number of shots in a case where a deflection region is irradiated with a shot of a charged particle beam;
calculating a deflection region shape of the deflection region depending on the number of shots, by using measurement data on writing positions of a plurality of evaluation patterns obtained by varying the number of shots by changing a number of a plurality of non-resolution shots of a micro-size beam equivalent to an unresolved dose;
correcting a deflection position of the charged particle beam to be shot in the deflection region, depending on the number of shots to be shot in the deflection region; and
writing a pattern on a target object by deflecting the charged particle beam to a corrected deflection position on the target object.

10. A charged particle beam writing apparatus comprising:
an area density calculation circuit configured to calculate an area density of a pattern arranged in each of a plurality of processing regions obtained by dividing a writing region of a target object by a size of an irradiation region which is irradiated with multi-beam shots of whole multi charged particle beams;
a correction circuit configured to correct a dose amount of a beam, using a change amount of an irradiation region shape of a processing region concerned in the plurality of processing regions, the change amount of the irradiation region shape varied depending on the area density of the each of the plurality of processing regions, the each of the plurality of processing regions having the size of the irradiation region irradiated with the multi-beam shots of the whole multi charged particle beams; and
a writing mechanism configured to irradiate the processing region concerned on the target object by the whole multi charged particle beams of a corrected dose amount.

11. A charged particle beam writing method comprising:
calculating an area density of a pattern arranged in each of a plurality of processing regions obtained by dividing a writing region of a target object by a size of an irradiation region which is irradiated with multi-beam shots of whole multi charged particle beams;
correcting a dose amount of a beam, using a change amount of an irradiation region shape of a processing region concerned in the plurality of processing regions, the change amount of the irradiation region shape varied depending on the area density of the each of the plurality of processing regions, the each of the plurality of processing regions having the size of the irradiation region irradiated with the multi-beam shots of the whole multi charged particle beams; and
irradiating the processing region concerned on the target object by the whole multi charged particle beams of a corrected dose amount.

12. The apparatus according to claim 10, wherein the change amount of the irradiation region shape is calculated using a plurality of evaluation patterns obtained by varying the area density of the irradiation region irradiated with the multi-beam shots of the whole multi charged particle beams.

13. The charged particle beam writing method according to claim 11, wherein the change amount of the irradiation region shape is calculated using a plurality of evaluation patterns obtained by varying the area density of the irradiation region irradiated with the multi-beam shots of the whole multi charged particle beams.

* * * * *